(12) United States Patent
Tougou

(10) Patent No.: US 6,335,641 B1
(45) Date of Patent: Jan. 1, 2002

(54) AUTOMATIC INPUT THRESHOLD SELECTOR

(75) Inventor: Takaaki Tougou, Hyogo (JP)

(73) Assignees: Mitsubishi Electric System LSI Design Corporation; Mitsubishi Denki Kabushiki Kaisha, both of Itami (JP)

( * ) Notice: Subject to any disclaimer, the term of this patent is extended or adjusted under 35 U.S.C. 154(b) by 0 days.

(21) Appl. No.: 09/476,327

(22) Filed: Jan. 3, 2000

(30) Foreign Application Priority Data

Jul. 29, 1999 (JP) .................................................. 11-215298

(51) Int. Cl.[7] .............................. H03K 5/22; H03K 5/153
(52) U.S. Cl. ................................... 327/73; 327/78; 327/82; 327/97; 327/307; 327/62; 375/318; 375/319; 330/11
(58) Field of Search .................................. 327/60, 62, 68, 327/72, 73, 75, 76, 74, 78, 82, 97, 307, 310; 330/11; 375/317–319

(56) References Cited

U.S. PATENT DOCUMENTS 4,574,206 A * 3/1986 Todokoro et al. ............... 327/68
5,052,021 A * 9/1991 Goto et al. ...................... 327/310
5,376,834 A * 12/1994 Carobolante .................. 327/143

FOREIGN PATENT DOCUMENTS

| JP | 60-38955 | | 2/1985 |
| JP | 62-18847 A | * | 1/1987 |
| JP | 6-111033 | | 4/1994 |

* cited by examiner

Primary Examiner—Terry D. Cunningham
Assistant Examiner—Long Nguyen
(74) Attorney, Agent, or Firm—Burns, Doane, Swecker & Mathis, LLP

(57) ABSTRACT

An automatic input threshold selector includes a maximum value level decision circuit, and an input threshold setting circuit. The maximum value level decision circuit decides, among m+1 level layers defined by m maximum value decision levels, a level layer to which the maximum value of an input signal belongs. The input threshold setting circuit sets an input threshold by selecting one of n input threshold candidates in response to the level layer to which the input signal maximum value belongs. These circuits are implemented as a simple combination of a voltage comparator, logic gates and the like. This makes it possible to solve a problem of a conventional automatic input threshold selector in that its circuit scale and power consumption is rather large because it includes a peak-hold circuit and a bottom-hold circuit.

5 Claims, 16 Drawing Sheets

FIG.8

| | | |
|---|---|---|
| VIP<VR31a | VIB<VR33b | VT3=VT31 |
| | VR33b<VIB<VR32b | VT3=VT32 |
| | VR32b<VIB<VR31b | VT3=VT33 |
| | VR31b<VIB | VT3=VT34 |
| VR31a<VIP<VR32a | VIB<VR33b | VT3=VT32 |
| | VR33b<VIB<VR32b | VT3=VT33 |
| | VR32b<VIB<VR31b | VT3=VT34 |
| | VR31b<VIB | VT3=VT35 |
| VR32a<VIP<VR33a | VIB<VR33b | VT3=VT33 |
| | VR33b<VIB<VR32b | VT3=VT34 |
| | VR32b<VIB<VR31b | VT3=VT35 |
| | VR31b<VIB | VT3=VT36 |
| VR33a<VIP | VIB<VR33b | VT3=VT34 |
| | VR33b<VIB<VR32b | VT3=VT35 |
| | VR32b<VIB<VR31b | VT3=VT36 |
| | VR31b<VIB | VT3=VT37 |

AUTOMATIC INPUT THRESHOLD SELECTOR

BACKGROUND OF THE INVENTION

1. Field of the Invention

The present invention relates to an automatic input threshold selector for digitally controlling a signal with an unfixed amplitude level such as a mouse signal by a one-chip microcomputer.

2. Description of Related Art

A mouse, an input device of a personal computer and the like, includes a light emitting device, a photo-detector and a disk with slits, which is placed between them and rotates in response to the movement of the mouse. The photo-device receives the light emitted from the light emitting device through the disk, and outputs a sinusoidal signal as the disk rotates. The sinusoidal signal is supplied to the one-chip microcomputer or the like to undergo digital processing. The sinusoidal signal, however, has an unfixed amplitude level because of variations in characteristics of the light emitting device and photo-device or of the degradation due to long-term use thereof. Therefore, to achieve accurate digital signal processing of such a sinusoidal signal with an uncertain amplitude level as of the mouse signal, it is necessary to suitably set an input threshold in accordance with the amplitude level of the sinusoidal signal.

FIG. 19 is a schematic diagram showing an arrangement of a conventional automatic input threshold selector. In FIG. 19, the reference numeral 21 designates a peak-hold circuit for detecting a maximum value of an input signal IN and for holding it; 22 designates a bottom-hold circuit for detecting a minimum value of the input signal IN and for holding it; 23 designates a voltage comparator for comparing the input signal IN with a reference level VR given as a threshold voltage. The voltage comparator of the automatic input threshold selector receives at its non-inverting input terminal the input signal IN, and at its inverting input terminal the threshold voltage VR generated by dividing with resistors R1 and R2 the difference between the maximum voltage output from the peak-hold circuit 21 and the minimum voltage output from the bottom-hold circuit 22.

Next, the operation of the conventional automatic input threshold selector will be described.

The voltage comparator 23 compares the input signal IN with the reference level VR. If the input signal IN is lower than the reference level VR, it outputs an "L" level signal as its output signal OUT, and if the input signal IN is higher than the reference level VR, it outputs an "H" level signal as the output signal OUT.

With the foregoing structure, the conventional automatic input threshold selector generates the reference level VR by dividing the difference between the maximum voltage and minimum voltage of the input signal held by the peak-hold circuit 21 and bottom-hold circuit 22. This, however, presents a problem of requiring a rather bulk circuit arrangement and large power consumption, resulting in a cost increase and low performance, considering that the automatic input threshold selector is installed in a semiconductor integrated circuit fabricated by a CMOS process.

SUMMARY OF THE INVENTION

The present invention is implemented to solve the foregoing problem. It is therefore an object of the present invention to provide an automatic input threshold selector with a rather small size and low power consumption. This is achieved by selecting an input threshold from a few predetermined levels in response to a compared result of the input signal with predetermined reference levels.

According to one aspect of the present invention, there is provided an automatic input threshold selector comprising: level decision means for deciding, among a plurality of level layers determined by a predetermined number of decision levels, a level layer to which a level of an input signal belongs; and input threshold setting means for selecting, in response to the level layer decided by the level decision means, at least one of input threshold candidates from among a predetermined number of input threshold candidates.

Here, the level decision means may decide, among the plurality of level layers, a level layer to which one of a maximum value and a minimum value of the input signal belongs; and the input threshold setting means may select, in response to the level layer decided by the level decision means, at least one of n input threshold candidates, where n is a natural number.

The level decision means may comprise: a reference level selecting switch for selecting one of the predetermined number of decision levels as a reference level; a first voltage comparator for comparing the input signal with the reference level; a logic gate for carrying out on-off control of a clock signal in response to an output signal of the voltage comparator; a shift register for shifting, in response to an output signal of the logic gate, its output state every time the input signal crosses the reference level in one of rising and falling directions of the input signal; and a decoder for outputting signals for identifying the level layer of the input signal in response to output signals of the shift register, wherein the reference level selecting switch may select the reference level in accordance with the output signals of the decoder, the input threshold setting means may comprise: the decoder; and an input threshold selecting switch for selecting, in response to the outputs of the decoder, one of the n input threshold candidates as the input threshold, and the automatic input threshold selector may further comprise a second voltage comparator for comparing the input signal with the input threshold.

The level decision means may comprise: maximum value level decision means for deciding, among (j+1) level layers determined by j maximum value decision levels, a level layer to which a maximum value of the input signal belongs, where j is a natural number; and minimum value level decision means for deciding, among (m+1) level layers determined by m maximum value decision levels, a level layer to which a minimum value of the input signal belongs, where m is a natural number, wherein the input threshold setting means may set the input threshold by selecting one of the input threshold candidates in response to the level layer decided by the maximum value level decision means and to the level layer decided by the minimum value level decision means.

The input threshold setting means may comprise: a first input threshold selecting switch for selecting, in response to the level layer decided by the level decision means, one of the n input threshold candidates as a first input threshold; and a second input threshold selecting switch for selecting, in response to the level layer decided by the level decision means, another one of the n input threshold candidates as a second input threshold, and the automatic input threshold selector may further comprise Schmitt circuit means for comparing the input signal with the first input threshold when the input signal is rising, and with the second threshold when the input signal is falling.

The level decision means may comprise: maximum value level decision means for deciding, among (j+1) level layers determined by j maximum value decision levels, a level layer to which a maximum value of the input signal belongs, where j is a natural number; and minimum value level decision means for deciding, among (m+1) level layers determined by m maximum value decision levels, a level layer to which a minimum value of the input signal belongs, where m is a natural number, the input threshold setting means may comprise: first input threshold setting means for setting a first input threshold by selecting one of predetermined n1 first input threshold candidates in response to the level layer decided by the maximum value level decision means, where n1 is a natural number; and second input threshold setting means for setting a second input threshold by selecting one of predetermined n2 second input threshold candidates in response to the level layer decided by the minimum value level decision means, where n2 is a natural number, and the automatic input threshold selector may further comprise Schmitt circuit means for comparing the input signal with the first input threshold when the input signal is rising, and with the second threshold when the input signal is falling.

The level decision means may comprise: rising decision level identifying means for identifying, when the input signal is rising, a level the input signal exceeds among j rising decision levels, where j is a natural number; and falling decision level identifying means for identifying, when the input signal is falling, a level the input signal falls below among m falling decision levels, wherein the input threshold setting means may set, when the input signal is rising, the input threshold by selecting one of n input threshold candidates in response to the rising decision level decided by the rising decision level identifying means, where n is a natural number, and may set, when the input signal is falling, the input threshold by selecting one of the n input threshold candidates in response to the falling decision level decided by the falling decision level identifying means.

The automatic input threshold selector may further comprise input threshold initializing means for initializing by means of software the input threshold that has been set.

The automatic input threshold selector may further comprise a signal line, connected to a reset input terminal of the shift register, for supplying the shift register with a shift register initializing signal by means of software.

The level decision means may comprise level decision disabling means for halting operation of the level decision means by means of software.

The first voltage comparator may comprise an enable signal input terminal for supplying the first voltage comparator with an enable signal for locking an output of the first voltage comparator.

The input threshold setting means may comprise input threshold check means for checking, by means of software, the input threshold that has been set.

The input threshold setting means may comprise a register for storing the outputs of the decoder.

The input threshold setting means may comprise means for setting the input threshold at a desired value by means of software.

The input threshold setting means may comprise a register for storing a desired value determined by means of software, and a selector for selecting one of the output of the decoder and an output of the register for controlling the input threshold selecting switch.

BRIEF DESCRIPTION OF THE DRAWINGS

FIG. 8 is a table illustrating relationships between a maximum value VIP and minimum value VIB of the input signal IN and the input threshold VT3 of FIG. 7;

DETAILED DESCRIPTION OF THE PREFERRED EMBODIMENTS

The embodiments in accordance with the present invention will now be described with reference to the accompanying drawings.

Emdodiment 1

Figure 1:
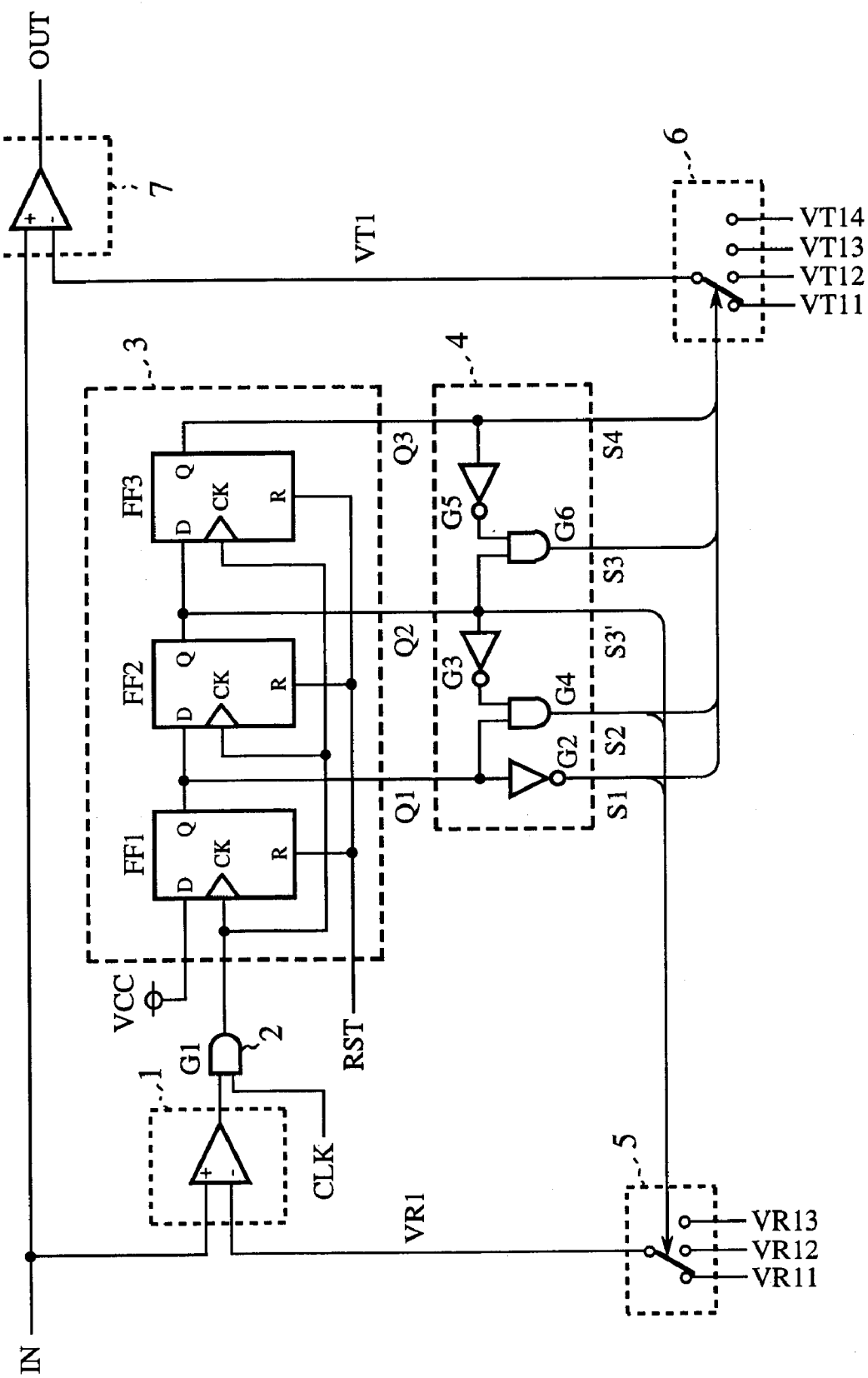
FIG. 1 is a circuit diagram showing a configuration of an embodiment 1 of the automatic input threshold selector in accordance with the present invention.

FIG. 1 is a circuit diagram showing a configuration of an embodiment 1 of the automatic input threshold selector in accordance with the present invention. The present embodiment 1 of the automatic input threshold selector is characterized by setting its input threshold VT1 in accordance with a decision result of a level layer to which the maximum value of the input signal belongs. In FIG. 1, the reference numeral 1 designates a voltage comparator; 2 designates a two-input AND gate; 3 designates a shift register including three D flip-flops FF1, FF2 and FF3; 4 designates a decoder including three inverters G2, G3 and G5 and two-input AND gates G4 and G6; 5 designates a reference level selecting switch; 6 designates an input threshold selecting switch; and 7 designates a voltage comparator. The symbol IN designates an input signal; OUT designates an output signal; CLK designates a clock signal; RST designates a reset signal; VR1 designates a reference level; VT1 designates an input threshold; VR11, VR12 and VR13 each designate a maximum value decision level; and VT11, VT12, VT13 and VT14 each designate an input threshold candidate. Here, the maximum value decision levels are assumed to have a relationship VR11 <VR12<VR13.

Next, functions of the individual components will be described.

The voltage comparator 1 compares the level of the input signal IN with that of the reference level VR1, and outputs an "L" level signal when the level of the input signal IN is lower than the reference level VR1, and an "H" level signal when the level of the input signal IN is higher than the reference level VR1. To achieve this, the voltage comparator 1 receives at its non-inverting input terminal the input signal IN, and at its inverting input terminal the reference level VR1. The AND gate 2 outputs a logical multiplication of the output of the voltage comparator 1 and the output of the clock signal CLK. In the case where the clock signal CLK is a steady signal, the AND gate 2 disables the output of the clock signal CLK when the output of the voltage comparator 1 is at the "L" level, and enables the output of the clock signal CLK when the output of the voltage comparator 1 is at the "H" level. In this case, the frequency of the clock signal CLK is about 1 MHz, for example.

The shift register 3 has its data input terminal connected to the VCC level, that is, to the "H" level signal, its clock input terminal connected to the output of the AND gate 2, and its reset input terminal connected to a reset signal RST. The initial value of the shift register 3 is supplied by the reset signal RST (RST="H"), in which case, all the outputs Q1, Q2 and Q3 of the D flip-flops FF1, FF2 and FF3 in the shift register 3 are placed to the "L" level (Q1=Q2=Q3="L"). When the reset is released in this state (RST="L") and the rising edge of the clock signal CLK is supplied to the clock input terminal, Q1 rises to "H" (Q1="H" and Q2=Q3="L"). A next rising edge will place Q2 at "H" (Q1=Q2="H" and Q3="L"), and the following rising edge will place Q3 at "H" (Q1=Q2=Q3="H"). Afterward, no rising edges of the clock signal CLK will change the "H" level of the outputs Q1, Q2 and Q3 of the D flip-flops FF1, FF2 and FF3. Thus, the shift register 3 outputs the total of four output patterns: a first output pattern (Q1=Q2=Q3="L"), second output pattern (Q1="H" and Q2=Q3="L"), a third output pattern (Q1=Q2="H" and Q3="L") and a fourth output pattern (Q1=Q2=Q3="H").

The decoder 4 receives the outputs Q1, Q2 and Q3 from the shift register 3, and determines its outputs S1, S2, S3, S3' and S4 in response to the output patterns. The decoder 4 outputs S1="H" and S2=S3=S3'=S4="L" in response to the first output pattern (Q1=Q2=Q3="L") supplied from the shift register 3; outputs S2="H" and S1=S3=S3'=S4="L" in response to the second output pattern (Q1="H" and Q2=Q3= "L"); outputs S3=S3'="H" and S1=S2=S4="L" in response to the third output pattern (Q1=Q2="H" and Q3="L"), and outputs S3'=S4="H" and S1=S2=S3="L" in response to the fourth output pattern (Q1=Q2=Q3="H").

The switch 5 selects one of the maximum value decision levels VR11, VR12 and VR13 as the reference level VR1 in response to the outputs S1, S2 and S3' from the decoder 4, only one of which takes "H" level as described above. Accordingly, the switch 5 supplies as the reference level VR1 the decision level VR11 when S1 is "H", VR12 when S2 is "H", and VR13 when S3' is "H".

On the other hand, the switch 6 selects one of the input thresholds VT11, VT12, VT13 and VT14 as the input threshold VT1 in response to the outputs S1, S2, S3 and S4 of the decoder 4, only one of which takes the "H" level as described above. The switch 6 outputs as the input threshold VT1 the input threshold VT11 when S1 is "H", VT12 when S2 is "H", VT13 when S3 is "H" and VT 14 when S4 is "H".

The voltage comparator 7 compares the level of the input signal IN with that of the input threshold VT1, and supplies the compared result as the output signal OUT. Specifically, the voltage comparator 7 produces the output signal OUT of the "L" level when the input signal IN is lower than the input threshold VT1, and produces the output signal OUT of the "H" level when the input signal IN is higher than the input threshold VT1. To achieve this, the input signal IN is supplied to the non-inverting input terminal of the voltage comparator 7, and the input threshold VT1 is supplied to the inverting input terminal. Thus, the voltage comparator 7 functions for the input signal IN as an input buffer with the input threshold of VT1.

Figure 2:
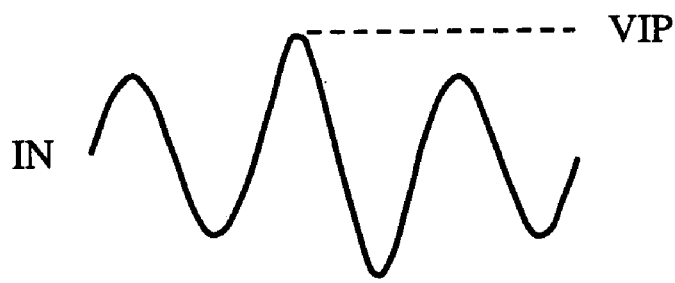
FIG. 2 is a diagram showing an example of waveforms of an input signal IN supplied to the automatic input threshold selector of FIG. 1.
Figure 3:
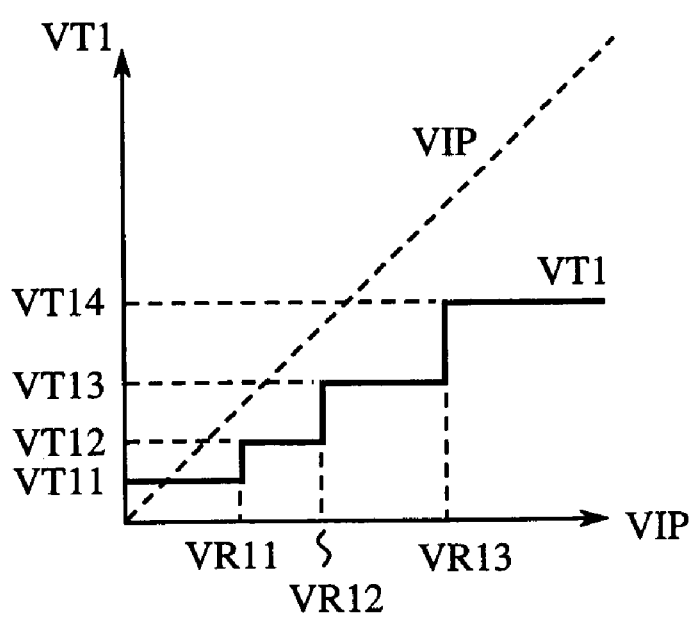
FIG. 3 is a graph illustrating relationships between a maximum value VIP of the input signal IN and the input threshold VT1 of FIG. 1.

Next, the operation of the present embodiment 1 of the automatic input threshold selector will be described. FIG. 2 illustrates an example of waveforms of the input signal IN to the automatic input threshold selector. The input signal IN is a sinusoidal wave with a frequency of about 5 kHz at the maximum, for example. In FIG. 2, VIP designates the maximum value of the input signal IN. FIG. 3 is a graph illustrating relationships between the maximum value VIP of the input signal IN and the input threshold VT1. In the present embodiment 1, the input threshold VT1 is determined such as VT1=VT11 when VIP<VR11, VT1=VT12 when VR11<VIP<VR12, VT1=VT13 when VR12<VIP<VR13, and VT1=VT14 when VR13<VIP.

In addition, the initial value of the present embodiment 1 as shown in FIG. 1 is provided by the reset signal RST (RST ="H"). Because the output of the shift register 3 is at the first output pattern (Q1=Q2=Q3="L") in this case, the decoder 4 outputs S1="H" and S2=S3'=S3=S4="L", so that the switch 5 selects the maximum value decision level VR11 as the reference level VR1 (VR1=VR11), and the switch 6 selects the input threshold VT11 as the input threshold VT1 (VT1= VT11).

In response to the release of the reset (RST="L"), the automatic input threshold selector becomes active, and first, the voltage comparator 1 compares the level of the input signal IN with that of the reference level VR1 (=VR11). When the maximum value VIP of the input signal IN is lower than the reference level VR11 (VIP<VR11), the voltage comparator 1 outputs the "L" level signal, and hence the AND gate 2 disables the output of the clock signal CLK. Accordingly, shift register 3 maintains its initial state (Q1=

Q2=Q3="L") because the rising edge of the clock signal CLK is not supplied to the clock input terminal of the shift register 3. As a result, the switches 5 and 6 also maintain their initial states (VR1=VR11 and VT1 =VT11).

When the maximum value VIP of the input signal IN becomes higher than the reference level VR11 (VIP>VR11), the voltage comparator 1 outputs the "H" level signal at the time the level of the input signal IN exceeds the reference level VR11, so that the AND gate 2 enables the output of the clock signal CLK. When the rising edge of the clock signal CLK is supplied to the clock input terminal of the shift register 3 through the AND gate 2, the shift register 3 takes the second output pattern (Q1="H" and Q2=Q3="L"), and the decoder 4 outputs S2="H" and S1 =S3=S3'=S4="L". Thus, the switch 5 selects the maximum value decision level VR12 as the reference level VR1 (VR1=VR12), and the switch 6 selects the input threshold VT12 as the input threshold VT1 (VT1=VT12).

In response to the change of the reference level VR1 as described above, the voltage comparator 1 compares the level of the input signal IN with the reference level VR1 (=VR12). When the maximum value VIP of the input signal IN is lower than the reference level VR12 (VR11<VIP<VR12), the voltage comparator 1 outputs the "L" level signal, and the AND gate 2 disables the output of the clock signal CLK. Therefore, the rising edge of the clock signal CLK is not supplied to the clock input terminal of the shift register 3, so that the shift register 3 maintains its output state (Q1="H" and Q2=Q3="L"), and the switches 5 and 6 also maintain their current states (VR1=VR12 and VT1 =VT12).

When the maximum value VIP of the input signal IN becomes higher than the reference level VR12 (VIP>VR12), the voltage comparator 1 outputs the "H" level signal at the time the level of the input signal IN exceeds the reference level VR12, and the AND gate 2 enables the output of the clock signal CLK. Thus, in response to the rising edge of the clock signal CLK supplied to the clock input terminal of the shift register 3 via the AND gate 2, the shift register 3 takes the third output pattern (Q1 =Q2="H" and Q3="L"), and the decoder 4 outputs S3=S3'="H" and S1=S2=S4="L". In this case, the switch 5 selects the maximum value decision level VR13 as the reference level VR1 (VR1=VR13), and the switch 6 selects the input threshold VT13 as the input threshold VT1 (VT1=VT13).

In response to the change of the reference level VR1 as described above, the voltage comparator 1 compares the level of the input signal IN with the modified reference level VR1 (=VR13) When the maximum value VIP of the input signal IN is lower than the reference level VR13 (VR12<VIP<VR13), the voltage comparator 1 outputs the "L" level signal, and the AND gate 2 disables the output of the clock signal CLK. Therefore, the rising edge of the clock signal CLK is not supplied to the clock input terminal of the shift register 3, so that the shift register 3 maintains its output state (Q1=Q2="H" and Q3="L"), and the switches 5 and 6 also maintain their current states (VR1 VR13 and VT1= VT13).

When the maximum value VIP of the input signal IN becomes higher than the reference level VR13 (VIP>VR13), the voltage comparator 1 outputs the "H" level signal when the level of the input signal IN exceeds the reference level VR13, and the AND gate 2 enables the output of the clock signal CLK. Thus, in response to the rising edge of the clock signal CLK supplied to the clock input terminal of the shift register 3 via the AND gate 2, the shift register 3 takes the fourth output pattern (Q1=Q2=Q3="H"), and the decoder 4 outputs S3'=S4="H" and S1 =S2=S3="L". In this case, the switch 5 maintains selecting the maximum value decision level VR13 as the reference level VR1 (VR1=VR13), and the switch 6 selects the input threshold VT14 as the input threshold VT1 (VT1=VT14).

Once this state (VR1=VR13 and VT1=VT14) has been established, supply of further rising edges of the clock signal CLK to the clock input terminal of the shift register 3 does not change the output state of the shift register 3. As a result, the selector maintains the input threshold VT1 at the level VT14 until the reset input (RST="H") is applied.

As described above, according to the present embodiment 1, the voltage comparator 1, AND gate 2, shift register 3, decoder 4 and reference level selecting switch 5 constitute a maximum value level decision means; and the decoder 4 and input threshold selecting switch 6 constitute an input threshold setting means for setting the input threshold VT1 in response to the level layer to which the maximum value VIP of the input signal IN belongs. This offers an advantage of being able to implement a circuit that can automatically set the input threshold in response to the level layer to which the maximum value of the input signal belongs.

In addition, the automatic input threshold selector can be constructed rather easily in the form of a combination of the voltage comparators and logical gates and the like. This offers an advantage of being able to implement a small size, low power consumption circuit.

Incidentally, although the present embodiment 1 of the automatic input threshold selector as shown in FIG. 1 has three maximum value decision levels, and four input threshold candidates, it is obvious that their numbers are not limited to these numbers, and can be determined at any numbers according to the performance required of the automatic input threshold selector.

Embodiment 2

Figure 4:
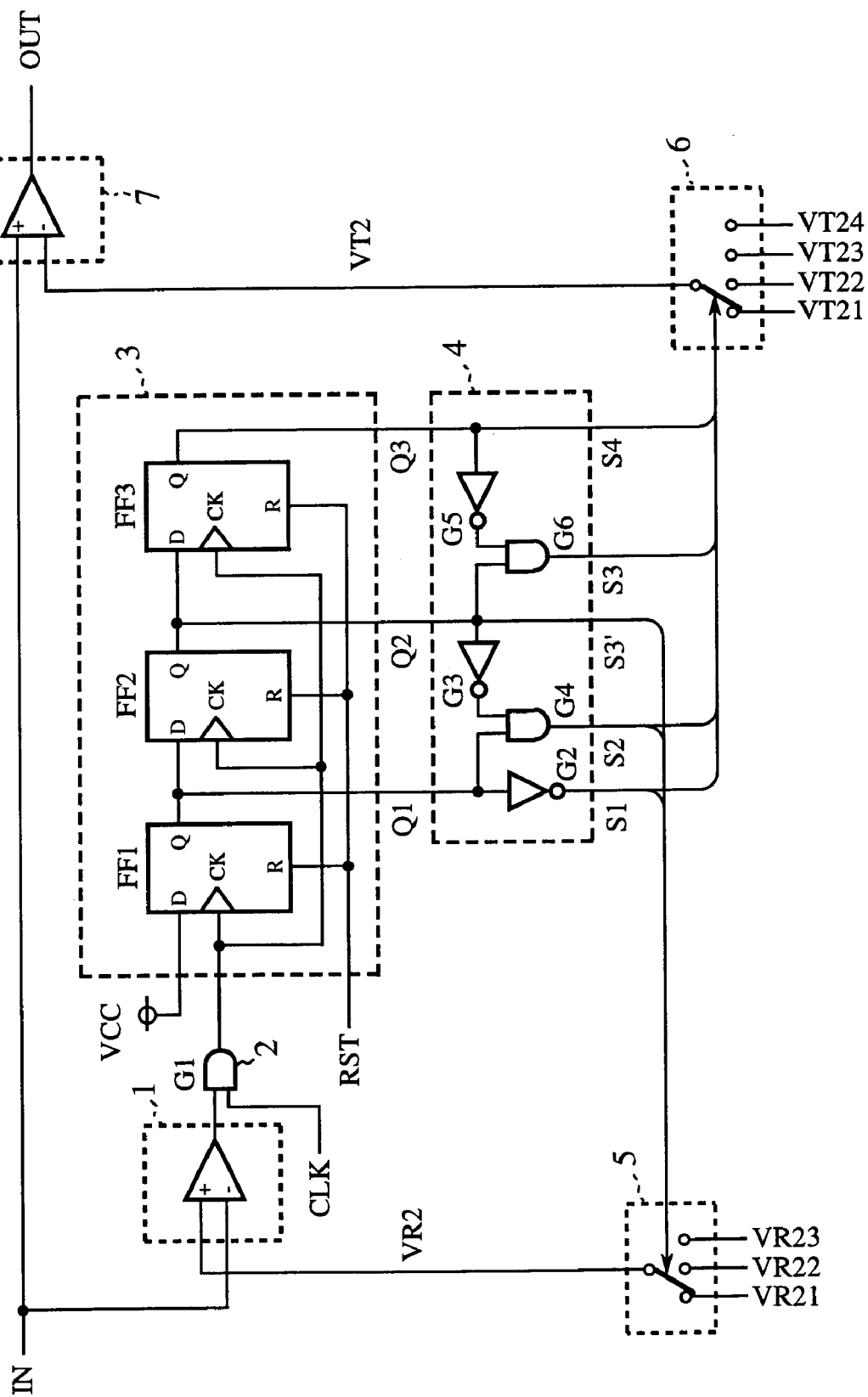
FIG. 4 is a circuit diagram showing a configuration of an embodiment 2 of the automatic input threshold selector in accordance with the present invention.

FIG. 4 is a circuit diagram showing a configuration of an embodiment 2 of the automatic input threshold selector in accordance with the present invention. The present embodiment 2 of the automatic input threshold selector is characterized by setting its input threshold in accordance with a decision result of a level layer to which the minimum value of the input signal belongs. In FIG. 4, the same reference numerals designate the same or like portions to those of FIG. 1, and hence the description thereof is omitted here. The present embodiment 2 differs from the foregoing embodiment 1 in that the voltage comparator 1 receives a reference level VR2 at its non-inverting input terminal, and the input signal IN at the inverting input terminal. In FIG. 4, the reference symbol VR2 designates the reference level; VT2 designates an input threshold; VR21, VR22 and VR23 each designate a minimum value decision level; and VT21, VT22, VT23 and VT24 each designate an input threshold candidate. Here, the minimum value decision levels are assumed to have a relationship VR21>VR22>VR23.

Next, functions of the individual components will be described.

The voltage comparator 1 compares the level of the input signal IN with the reference level VR2, and outputs the "L" level signal when the level of the input signal IN is higher than the reference level VR2, and the "H" level signal when the level of the input signal IN is lower than the reference level VR2.

The switch 5 selects one of the minimum value decision levels VR21, VR22 and VR23 as the reference level VR2 in response to the outputs S1, S2 and S3' from the decoder 4, only one of which takes the "H" level as described above. Thus, the switch 5 supplies as the reference level VR2 the decision level VR21 when S1 is "H", VR22 when S2 is "H", and VR23 when S3' is "H".

On the other hand, the switch 6 selects one of the input threshold candidates VT21, VT22, VT23 and VT24 as the input threshold VT2 in response to the outputs S1, S2, S3 and S4 of the decoder 4, only one of which takes the "H" level as described above. Thus, the switch 6 outputs as the input threshold VT2 the input threshold candidate V211 when S1 is "H", VT22 when S2 is "H", VT23 when S3 is "H" and VT 24 when S4 is "H".

Since the functions of the AND gate 2, shift register 3, decoder 4 and voltage comparator 7 as shown in FIG. 4 are the same as those of their counterparts of the foregoing embodiment 1 of the automatic input threshold selector as shown in FIG. 1, the description thereof is omitted here.

Figure 5:
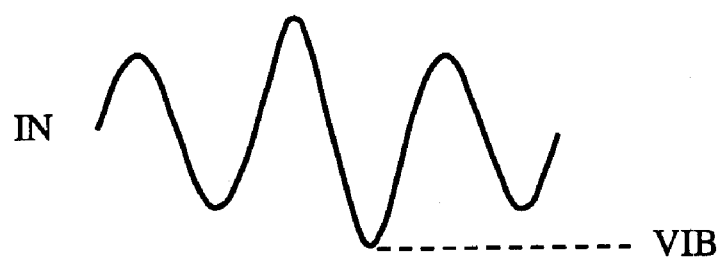
FIG. 5 is a diagram showing an example of waveforms of the input signal IN supplied to the automatic input threshold selector of FIG. 4.
Figure 6:
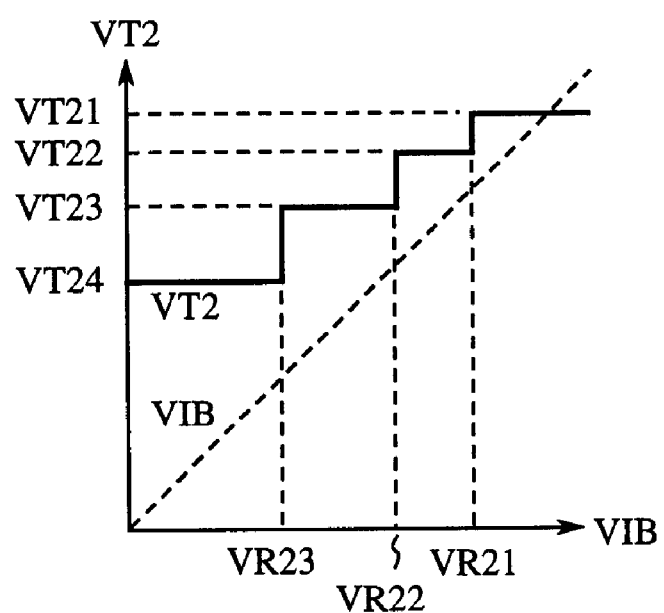
FIG. 6 is a graph illustrating relationships between a minimum value VIB of the input signal IN and the input threshold VT2 of FIG. 4.

FIG. 5 shows an example of waveforms of the input signal IN to the automatic input threshold selector. In FIG. 5, the minimum value of the input signal IN is designated by VIB. FIG. 6 is a graph illustrating relationships between the minimum value VIB of the input signal IN and the input threshold VT2. As illustrated in FIG. 6, in the present embodiment 2, the input threshold VT2 is determined such as VT2=VT21 when VIB>VR21, VT2=VT22 when VR21>VIB>VR22, VT2=VT23 when VR22>VIB >VR23, and VT2=VT24 when VR23>VIB.

The present embodiment 2 differs from the foregoing embodiment 1 in that the voltage comparator 1 outputs the "H" level signal when the level of the input signal IN is lower than the reference level VR2, and that the value of the reference level VR2 is changed in accordance with the new pattern output from the shift register 3. Since the remaining operation is the same as that of the embodiment 1, the description of the operation of the present embodiment 2 will be omitted. In brief, although the foregoing embodiment 1 sets the input threshold by deciding the level layer to which the maximum value VIP of the input signal IN belongs, the present embodiment 2 sets the input threshold by deciding the level layer to which the minimum value VIB of the input signal IN belongs.

As described above, according to the present embodiment 2, the voltage comparator 1, AND gate 2, shift register 3, decoder 4 and reference level selecting switch 5 constitute a minimum value level decision means; and the decoder 4 and input threshold selecting switch 6 constitute an input threshold setting means for setting the input threshold VT2 in response to the level layer to which the minimum value VIB of the input signal IN belongs. This offers an advantage of being able to implement a circuit that can automatically set the input threshold in response to the level layer to which the minimum value of the input signal belongs.

In addition, the automatic input threshold selector can be constructed rather easily in the form of a combination of the voltage comparators, logical gates and the like. This offers an advantage of being able to implement a small size, low power consumption circuit.

Incidentally, although the present embodiment 2 of the automatic input threshold selector as shown in FIG. 4 has three minimum value decision levels, and four input threshold candidates, it is obvious that their numbers are not limited to these numbers, and can be determined at any numbers according to the performance required of the automatic input threshold selector.

Embodiment 3

Figure 7:
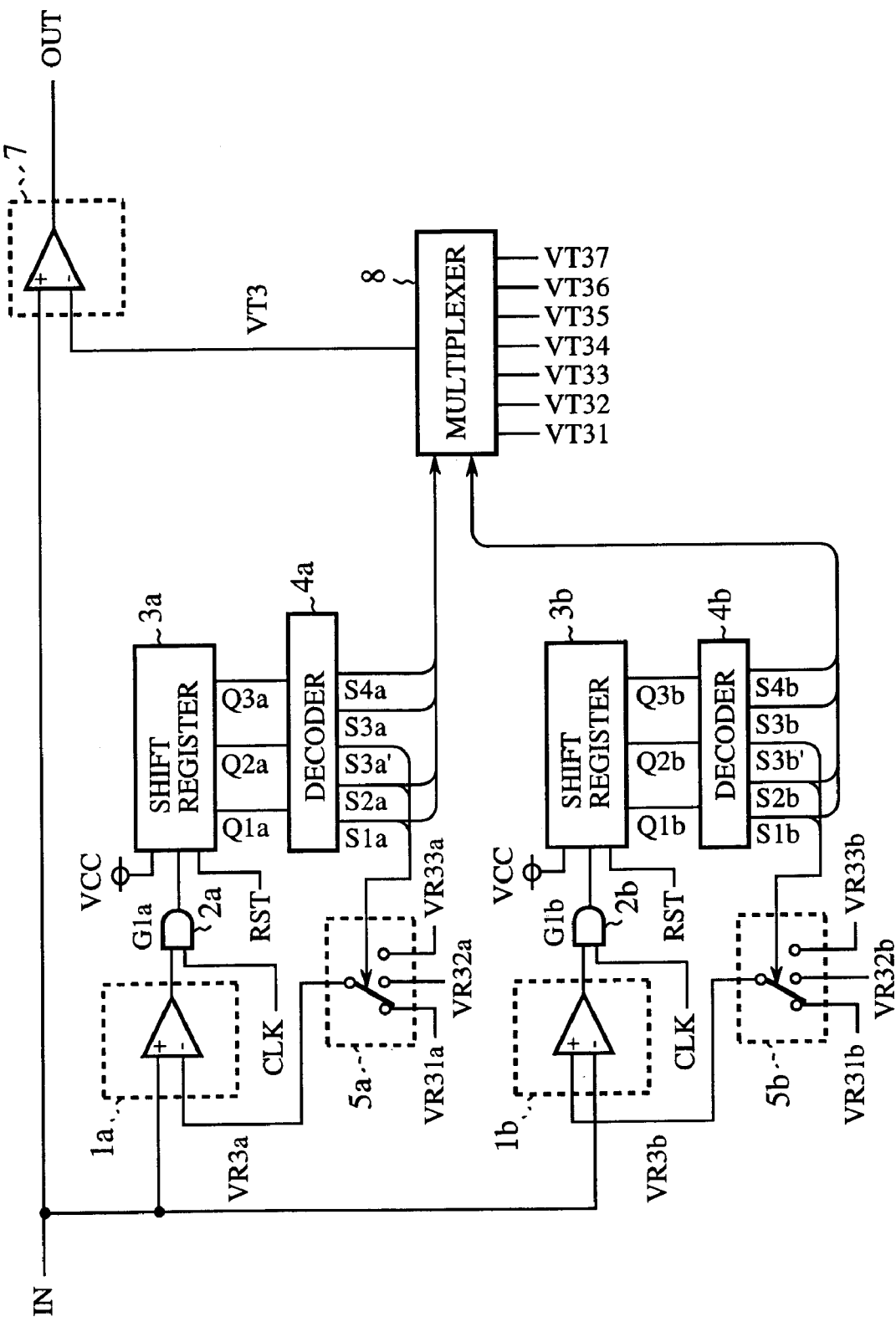
FIG. 7 is a circuit diagram showing a configuration of an embodiment 3 of the automatic input threshold selector in accordance with the present invention.

FIG. 7 is a block diagram showing an embodiment 3 of the automatic input threshold selector in accordance with the present invention. The present embodiment 3 is characterized by setting the input threshold in accordance with the results of deciding the level layer to which the maximum value of the input signal belongs and the level layer to which the minimum value thereof belongs.

In FIG. 7, a voltage comparator 1a, AND gate 2a, shift register 3a, decoder 4a and switch 5a are the same as the voltage comparator 1, AND gate 2, shift register 3, decoder 4 and switch 5 of the foregoing embodiment 1 as shown in FIG. 1; and a voltage comparator 1b, AND gate 2b, shift register 3b, decoder 4b, switch 5b are the same as the voltage comparator 1, AND gate 2, shift register 3, decoder 4 and switch 5 of the foregoing embodiment 2 as shown in FIG. 4. Thus, the description thereof is omitted here. The present embodiment 3 of the automatic input threshold selector is a combination of the embodiment 1 as shown in FIG. 1 and the embodiment 2 as shown in FIG. 4. It decides the level layer to which the maximum value of the input signal IN belongs by the voltage comparator 1a, AND gate 2a, shift register 3a, decoder 4a and switch 5a, and the level layer to which the minimum value of the input signal IN belongs by the voltage comparator 1b, AND gate 2b, shift register 3b, decoder 4b and switch 5b.

In FIG. 7, VR3a and VR3b each designate a reference level, VT3 designates an input threshold, VR31a, VR32a and VR33a each designate a maximum value decision level, VR31b, VR32b and VR33b each designate a minimum value decision level, VT31, VT32, VT33, VT34, VT35, VT36 and VT37 each designate an input threshold candidate. The maximum value decision levels have a relation VR31a<VR32a<VR33a, whereas the minimum value decision levels have a relation VR31b>VR32b>VR33b.

The reference numeral 8 designates a multiplexer. The multiplexer 8 has its input section connected to the outputs S1a, S2a, S3a and S4a of the decoder 4a and to the outputs S1b, S2b, S3b and S4b of the decoder 4b, and selects one of the input thresholds VT31, VT32, VT33, VT34, VT35, VT36 and VT37 as the input threshold VT3 in accordance with the input values.

Next, the operation of the embodiment 3 of the automatic input threshold selector will be described. The outputs S1a, S2a, S3a and S4a from the decoder 4a are determined by the maximum value VIP of the input signal IN such as S1a="H" and S2a=S3a =S4a="L" when VIP<VR31a; S2a="H" and S1a=S3a=S4a="L" when VR31a<VIP<VR32a; S3a="H" and S1a=S2a=S4a="L" when VR32a<VIP<VR33a, and S4a="H" and S1a=S2a=S3a ="L" when VR33a<VIP. On the other hand, the outputs S1b, S2b, S3b and S4b from the decoder 4b are determined by the minimum value VIB of the input signal IN such as S1b="H" and S2b=S3b=S4b="L" when VIB>VR31b; S2b="H" and S1b=S3b=S4b="L" when VR31b>VIB>VR32b; S3b="H" and S1b=S2b=S4b="L" when VR32b>VIB>VR33b; and S4b="H" and S1b=S2b= S3b "L" when VR33b>VIB.

FIG. 8 is a table showing relationships between the maximum value VIP and the minimum value VIB of the input signal IN, and the input threshold VT3 in the present embodiment 3 of the automatic input threshold selector. As shown in FIG. 8, the input threshold VT3 is categorized in accordance with the level layer to which the maximum value of the input signal IN belongs and the level layer to which the minimum value thereof belongs. Specifically, the multiplexer 8 selects one of the input threshold candidates VT31, VT32, VT33, VT34, VT35, VT36 and VT37 as the input threshold VT3 in accordance with the outputs S1a, S2a, S3a and S4a of the decoder 4a, which are decided by the maximum value VIP of the input signal IN, and with the outputs S1b, S2b, S3b and S4b of the decoder 4b, which are decided by the minimum value VIB of the input signal IN, such that the relationships as shown in FIG. 8 are met. The voltage comparator 7 functions as an input buffer whose input threshold is VT3 for the input signal IN.

As described above, the present embodiment 3 is configured such that the voltage comparator 1a, AND gate 2a, shift register 3a, decoder 4a and reference level selecting switch 5a constitute a maximum value level decision means; the voltage comparator 1b, AND gate 2b, shift register 3b, decoder 4b and reference level selecting switch 5b constitute a minimum value level decision means; and the decoder 4a, decoder 4b and multiplexer 8 constitute an input threshold setting means for setting the input threshold VT3 in accordance with the level layer to which the maximum value VIP of the input signal IN belongs and the level layer to which the minimum value VIB of the input signal IN belongs. This offers an advantage of being able to implement a circuit that can automatically set the input threshold in accordance with the level layer to which the input signal maximum value belongs, and with level layer to which the input signal minimum value belongs.

In addition, the automatic input threshold selector can be constructed rather easily in the form of a combination of the voltage comparators, logical gates and the like. This offers an advantage of being able to implement a small size, low power consumption circuit.

Incidentally, although the present embodiment 3 of the automatic input threshold selector as shown in FIG. 7 has three maximum value decision levels, three minimum value decision levels, and seven input threshold candidates, it is obvious that their numbers are not limited to these numbers, and can be determined at any numbers according to the performance required for the automatic input threshold selector.

Embodiment 4

Figure 9:
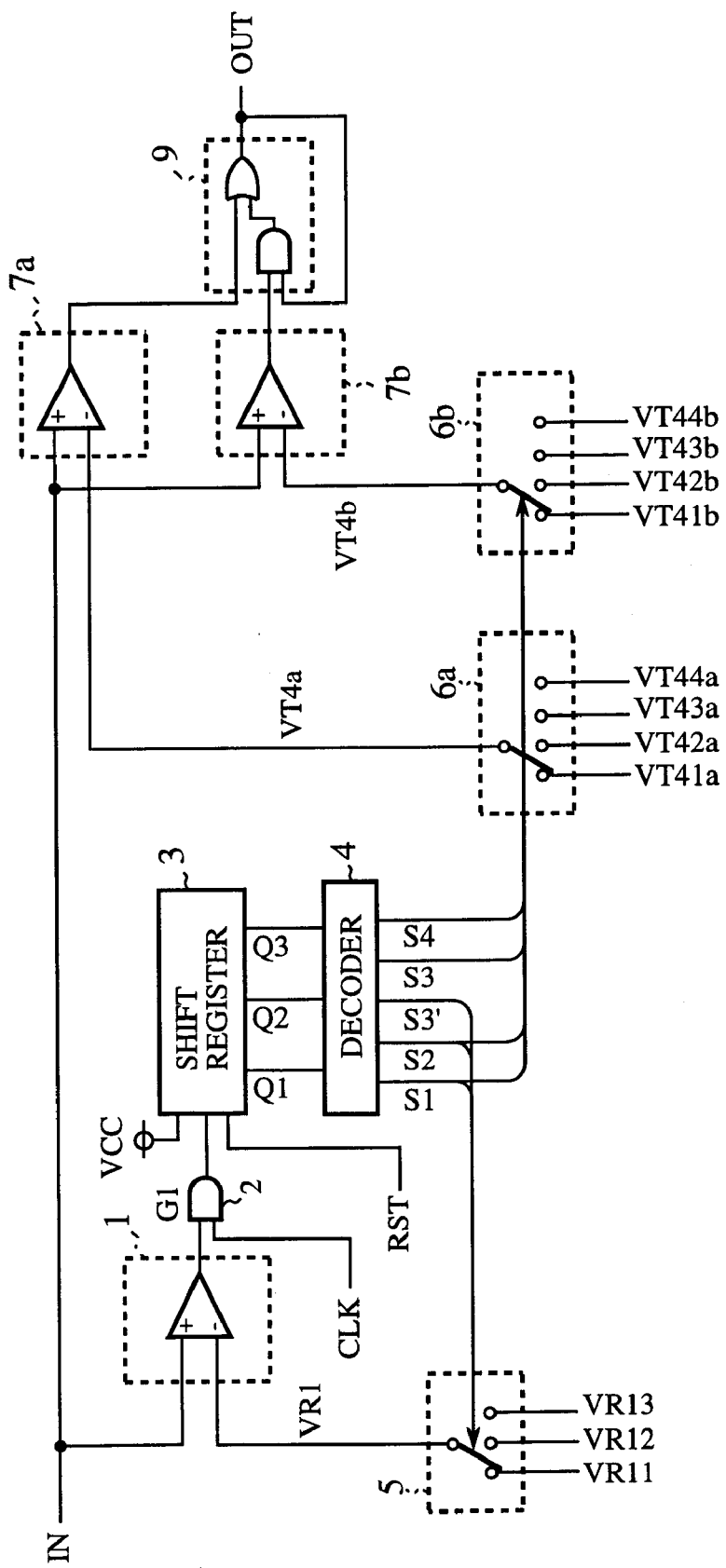
FIG. 9 is a circuit diagram showing a configuration of an embodiment 4 of the automatic input threshold selector in accordance with the present invention.

FIG. 9 is a block diagram showing an embodiment 4 of the automatic input threshold selector in accordance with the present invention. The present embodiment 4 of the automatic input threshold selector is characterized in that it configures a Schmitt circuit by setting two input thresholds in accordance with the decision result of the level layer to which the maximum value of the input signal belongs. In FIG. 9, the same reference numerals designate the same or like portions to those of FIG. 1 and the description thereof is omitted here. In FIG. 9, switches 6a and 6b are analogous to the switch 6 as shown in FIG. 1, and voltage comparators 7a and 7b are analogous to the voltage comparator 7 as shown in FIG. 1.

In FIG. 9, the reference numeral 9 designates a composite logic gate consisting of a two-input AND gate and a two-input OR gate. Reference symbols VT4a designates a first input threshold, VT4b designates a second input threshold, VT41a, VT42a, VT43a and VT44a each designate a first input threshold candidate, and VT41b, VT42b, VT43b and VT44b each designate a second input threshold candidate. Here, the input threshold candidates have relationships of VT41a>VT41b, VT42a>VT42b, and VT43a>VT43b and VT44a>VT44b.

Next, functions of the individual components will be described.

The switch 6a selects one of the first input threshold candidates VT41a, VT42a, VT43a and VT44a as the first input threshold VT4a under the control of the outputs S1, S2, S3 and S4 of the decoder 4, only one of which takes the "H" level without exception. More specifically, the switch 6a selects VT41a when S1 is "H", VT42a when S2 is "H", VT43a when S3 is "H" and VT44a when S4 is "H", as the first input threshold VT4a.

Likewise, the switch 6b selects one of the second input threshold candidates VT41b, VT42b, VT43b and VT44b as the second input threshold VT4b under the control of the outputs S1, S2, S3 and S4 of the decoder 4, only one of which takes the "H" level without exception as in the case of the switch 6a. More specifically, the switch 6b selects VT41b when S1 is "H", VT42b when S2 is "H", VT43b when S3 is "H" and VT44b when S4 is "H", as the second input threshold VT4b.

Figure 10:
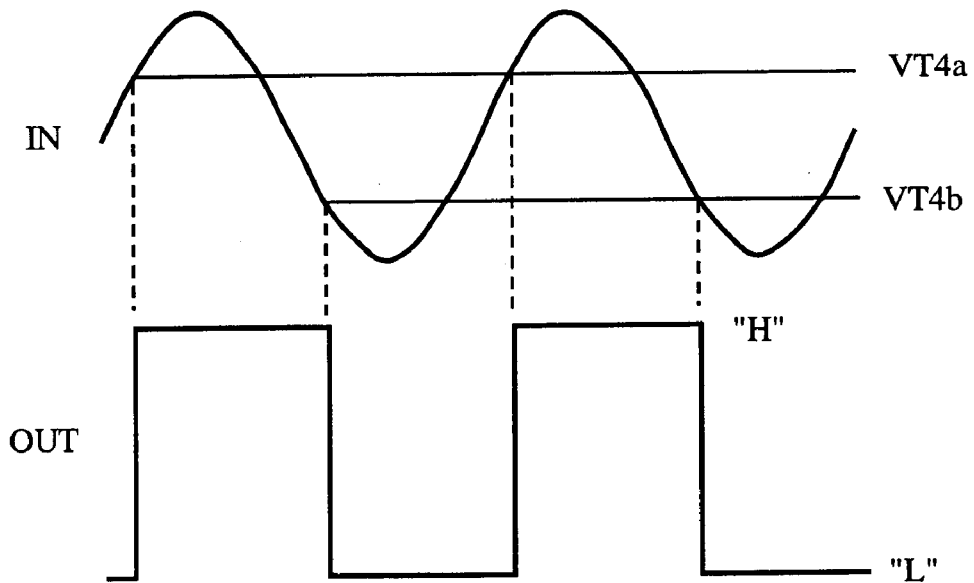
FIG. 10 is a diagram illustrating an example waveforms for explaining the operation of the embodiment 4 of the automatic input threshold selector.

The outputs S1, S2, S3 and S4 of the decoder 4 are determined by the maximum value VIP of the input signal IN such as VT4a=VT41a and VT4b=VT41b when VIP<VR11, VT4a=VT42a and VT4b=VT42b when VR11<VIP<VR12, VT4a=VT43a and VT4b=VT43b when VR12<VIP<VR13, and VT4a=VT44a and VT4b=VT44b when VR13<VIP. In other words, the first input threshold VT4a and second input threshold VT4b always hold the relationships of VT4a>VT4b as illustrated in FIG. 10.

The voltage comparator 7a compares the level of the input signal IN with that of the first input threshold VT4a, thereby functioning as an input buffer with the input threshold VT4a. Likewise, the voltage comparator 7b compares the level of the input signal IN with that of the second input threshold VT4b, thereby functioning as an input buffer with the input threshold VT4b.

The composite logic gate 9, receiving the logical outputs from the voltage comparators 7a and 7b, produces an output signal OUT. Because the input threshold VT4a of the voltage comparator 7a is higher than the input threshold VT4b of the voltage comparator 7b, the output signal OUT of the composite logic gate 9 is determined by the output state of the voltage comparator 7a when the input signal IN rises (when the output signal OUT is placed at the "L" level initially), and by the output state of the voltage comparator 7b when the input signal IN falls (when the output signal OUT is placed at the "H" level initially), thereby constructing the Schmitt circuit.

Since the functions of the voltage comparator 1, AND gate 2, shift register 3 and switch 5 as shown in FIG. 9 are the same as those of the foregoing embodiment 1 as shown in FIG. 1, the description thereof is omitted here.

Next, the operation of the embodiment 4 of the automatic input threshold selector in accordance with the present invention will be described. As illustrated in FIG. 10, when the input signal IN makes a transition from the low to high level, the output signal OUT changes its level from the "L" level to the "H" level when the input signal IN exceeds the first input threshold VT4a. On the other hand, when the input signal IN makes a transition from the high to low level, the output signal OUT changes its level from the "H" level to the "L" level when the input signal IN falls below the second input threshold VT4b.

As described above, according to the present embodiment 4, the voltage comparator 1, AND gate 2, shift register 3, decoder 4 and reference level selecting switch 5 constitute a maximum value level decision means; the decoder 4, and input threshold selecting switches 6a and 6b constitute an input threshold setting means for setting the two input thresholds VT4a and VT4b in accordance with level layer to which the maximum value VIP of the input signal IN belongs; and the voltage comparators 7a and 7b and composite logic gate 9 constitute the Schmitt circuit that uses the input threshold VT4a when the input signal rises, and the input threshold VT4b when the input signal falls. This offers an advantage of being able to implement a circuit that can automatically set the two input thresholds in accordance with the level layer to which the input signal maximum value belongs and that can provide the Schmitt circuit using the two input thresholds.

In addition, the automatic input threshold selector can be constructed rather easily in the form of a combination of the voltage comparators, logical gates and the like. This offers an advantage of being able to implement a small size, low power consumption circuit.

Incidentally, although the present embodiment 4 of the automatic input threshold selector as shown in FIG. 9 constructs the Schmitt circuit by modifying the foregoing embodiment 1, the Schmitt circuit can also be constructed by modifying the foregoing embodiment 2.

Embodiment 5

Figure 11:
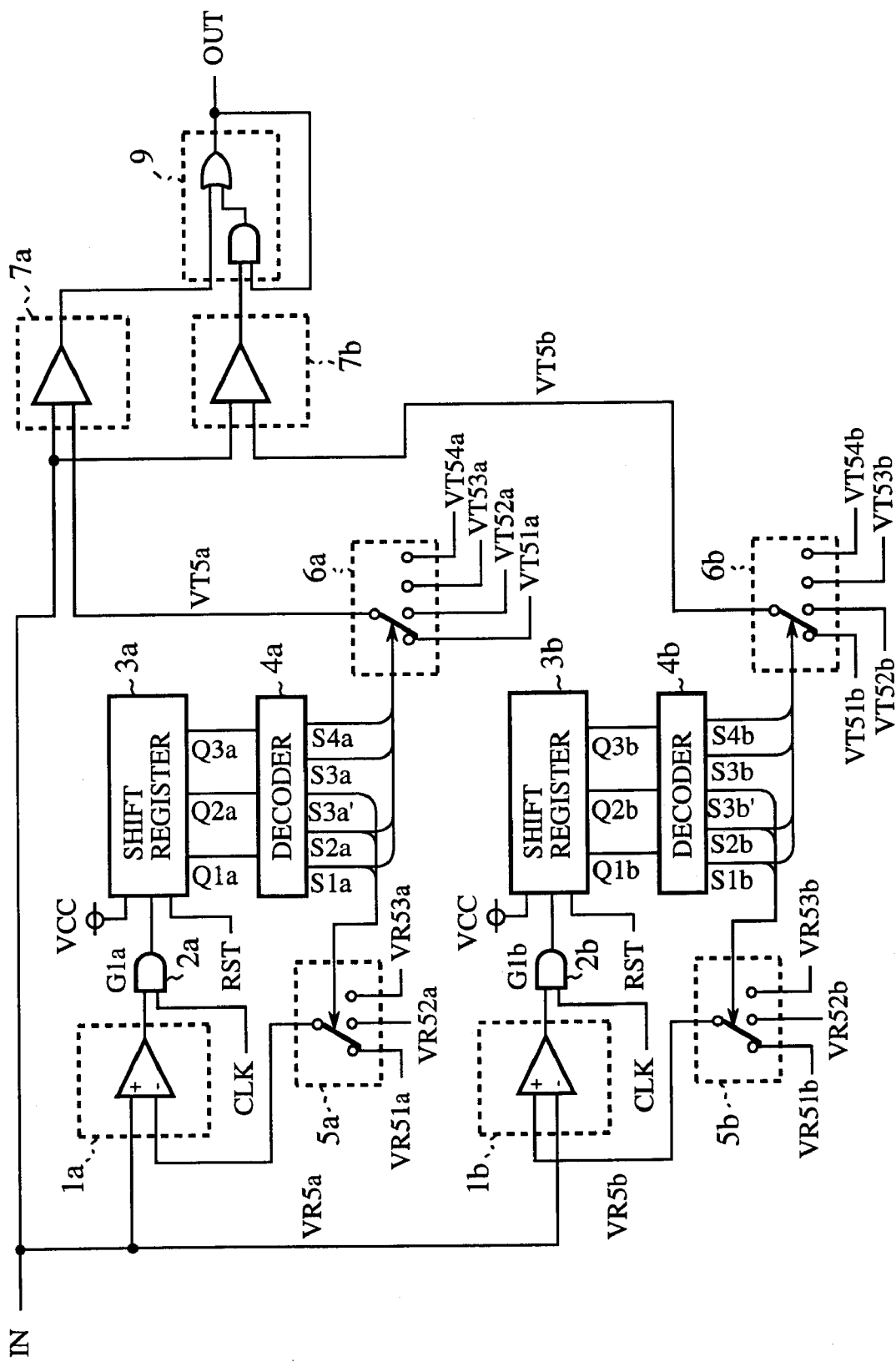
FIG. 11 is a circuit diagram showing a configuration of an embodiment 5 of the automatic input threshold selector in accordance with the present invention.

FIG. 11 is a block diagram showing an embodiment 5 of the automatic input threshold selector in accordance with the present invention. The present embodiment 5 is characterized by constituting a Schmitt circuit using two input thresholds that are set as the results of the decision of the level layers to which the maximum value and minimum value of the input signal belongs. In FIG. 11, the circuit composed of the voltage comparator 1a, AND gate 2a, shift register 3a, decoder 4a, switches 5a and 6a and voltage comparator 7a has the same structure and functions as the foregoing embodiment 1 of the automatic input threshold selector; and the circuit composed of the voltage comparator 1b, AND gate 2b, shift register 3b, decoder 4b, switches 5b and 6b and voltage comparator 7b has the same structure and functions as the foregoing embodiment 2 of the automatic input threshold selector. In addition, the reference numeral 9 designates the same composite logic gate as that of FIG. 9.

In FIG. 11, VR5a designates a first reference level; VR5b designates a second reference level; VR51a, VR52a and VR53a each designate a maximum value decision level; VR51b, VR52b and VR53b each designate a minimum value decision level; VT5a designates a first input threshold; VT5b designates a second input threshold; VT51a, VT52a, VT53a and VT54a each designate a first input threshold candidate; and VT51b, VT52b, VT53b and VT54b each designate a second input threshold candidate. It is assumed here that the maximum value decision levels have a relation VR51a<VR52a<VR53a, and the minimum value decision levels have a relation VR51b>VR52b>VR53b. In addition, the input thresholds VT5a and VT5b are set to have a relation VT5a>VT5b as in the foregoing embodiment 4.

The voltage comparator 7a functions as an input buffer with the input threshold VT5a, and the voltage comparator 7b functions as the input buffer with the input threshold VT5b. In addition, since the relation VT5a>VT5b holds, the Schmitt circuit is constructed by supplying the composite logic gate 9 with the output signals of the voltage comparators 7a and 7b.

Figure 12:
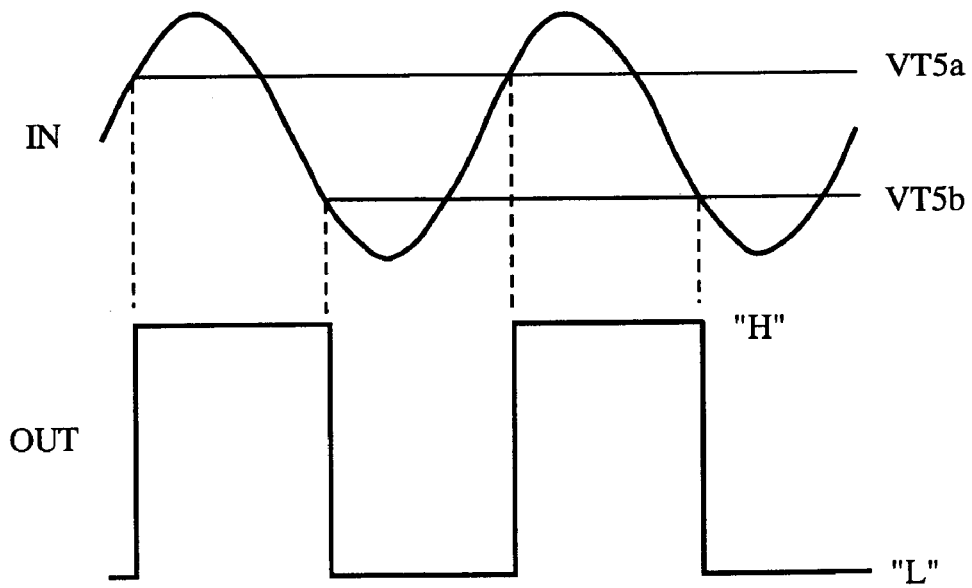
FIG. 12 is a diagram illustrating an example of waveforms for explaining the operation of the embodiment 5 of the automatic input threshold selector.

Next, the operation of the embodiment 5 of the automatic input threshold selector in accordance with the present invention will be described. FIG. 12 is a diagram illustrating an example of signal waveforms in the present embodiment 5. As illustrated in FIG. 12, when the input signal IN makes a transition from the low to high level, the output signal OUT changes its level from the "L" to "H" level when the input signal IN exceeds the first input threshold VT5a. On the other hand, when the input signal IN makes a transition from the high to low level, the output signal OUT changes from the "H" to "L" level when the input signal IN falls below the second input threshold VT5b.

As described above, according to the present embodiment 5, the voltage comparator 1a, AND gate 2a, shift register 3a, decoder 4a and reference level selecting switch 5a constitute a maximum value level decision means; the voltage comparator 1b, AND gate 2b, shift register 3b, decoder 4b and reference level selecting switch 5b constitute a minimum value level decision means; the decoder 4a and input threshold selecting switch 6a constitute a first input threshold setting means for setting the input threshold VT5a in accordance with the level layer to which the maximum value VIP of the input signal IN belongs; the decoder 4b and input threshold selecting switch 6b constitute a second input threshold setting means for setting the input threshold VT5b in accordance with the level layer to which the minimum value VIB of the input signal IN belongs; and the voltage comparators 7a and 7b and composite logic gate 9 constitute a Schmitt circuit configuration means that uses the input threshold VT5a when the input signal rises, and the input threshold VT5b when the input signal falls. This offers an advantage of being able to provide a circuit that can implement the Schmitt circuit by using the first input threshold automatically set in accordance with the level layer to which the maximum value of the input signal belongs and the second input threshold automatically set in accordance with the level layer to which the minimum value of the input signal belongs.

In addition, the automatic input threshold selector can be constructed rather easily in the form of a combination of the voltage comparators, logical gates and the like. This offers an advantage of being able to implement a small size, low power consumption circuit.

Incidentally, although the present embodiment 5 of the automatic input threshold selector as shown in FIG. 11 has three maximum value decision levels, three minimum value decision levels, four first input threshold candidates, and four second input threshold candidates, it is obvious that their numbers are not limited to these numbers, and can be determined at any numbers according to the performance required of the automatic input threshold selector.

Embodiment 6

Figure 13:
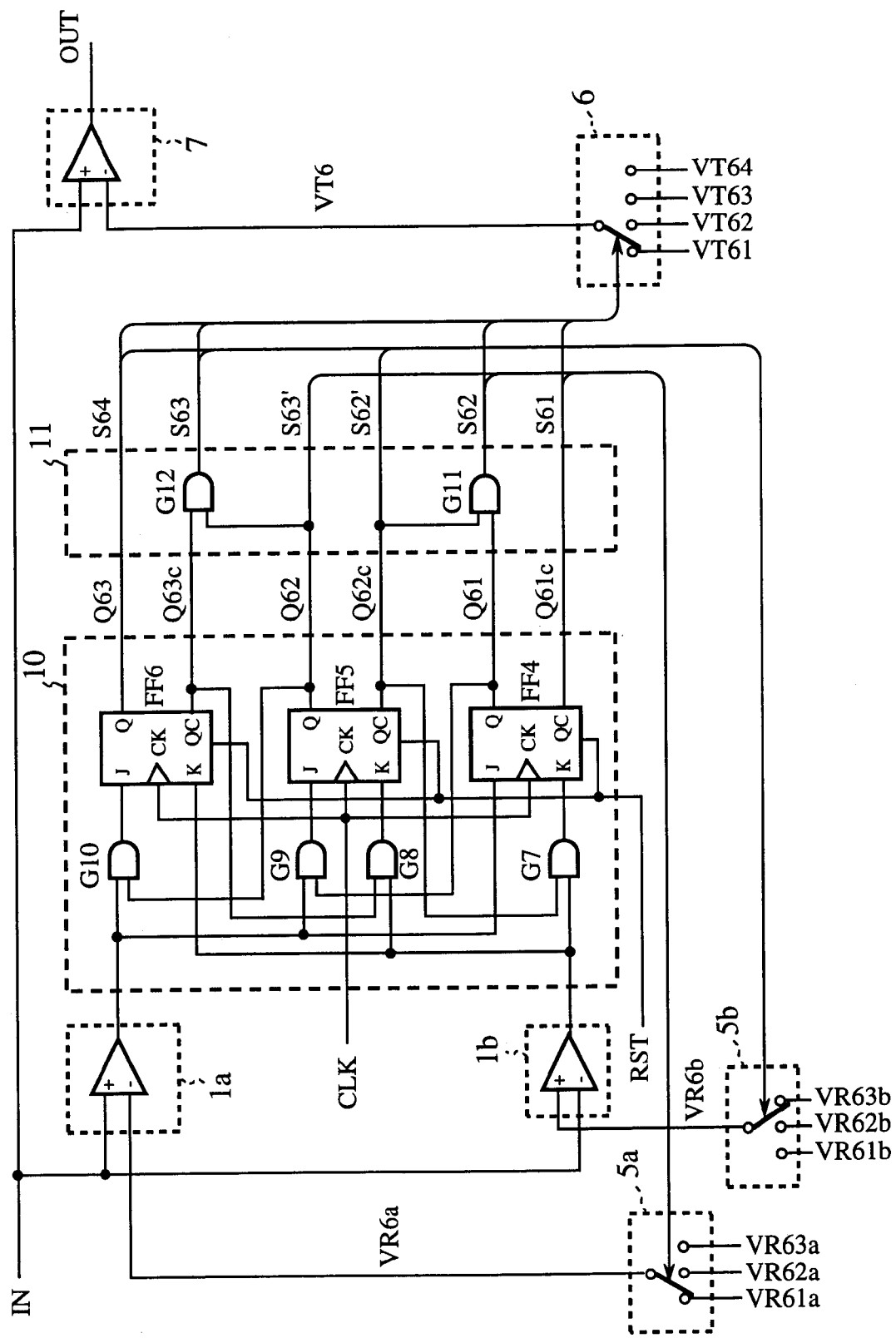
FIG. 13 is a circuit diagram showing a configuration of an embodiment 6 of the automatic input threshold selector in accordance with the present invention.

FIG. 13 is a circuit diagram showing an embodiment 6 of the automatic input threshold selector in accordance with the present invention. The present embodiment 6 of the automatic input threshold selector is characterized by automatically carrying out sequential setting of the input threshold in response to the level change in the input signal.

In FIG. 13, the reference numeral 10 designates a shift register; and 11 designates a decoder. The voltage comparator 1a, switch 5a, switch 6 and voltage comparator 7 have the same structure as the voltage comparator 1, switch 5, switch 6 and voltage comparator 7 shown in FIG. 1. The voltage comparator 1b and switch 5b have the same structure as the voltage comparator 1 and switch 5 shown in FIG. 4.

In addition, the reference symbol VR6a designates a first reference level; VR6b designates a second reference level; VR61a, VR62a and VR63a each designate a rising decision level; VR61b, VR62b and VR63b each designate a falling decision level; VT6 designates an input threshold; VT61, VT62, VT63 and VT64 each designate an input threshold candidate. Here, the rising decision levels have a relation VR61a<VR62a<VR63a, and the falling decision levels have a relation VR61b>VR62b>VR63b, where VR61a>VR61b.

In the shift register 10, the reference symbols G7, G8, G9 and G10 each designate a two-input AND gate; and FF4, FF5 and FF6 each designate a JK flip-flop. The shift register 10 loads the output signals of the voltage comparators 1a and 1b, and the JK flip-flops FF4, FF5 and FF6 each receive a reset signal RST at their reset input terminal, and a clock signal CLK at their input terminal. The JK flip-flops FF4, FF5 and FF6 are connected at their output side to signal lines outputting signals Q61 and Q61C, Q62 and Q62C, and Q63 and Q63C, respectively.

In the decoder 11, reference symbols G11 and G12 each designate a two-input AND gate. The decoder 11 receives at its input side the output signals Q61, Q61C, Q62, Q62C, Q63 and Q63C of the shift register 11, and is connected at its output side to signal lines outputting signals S61, S62, S62', S63, S63' and S64.

The switch 5a selects one of the rising decision levels VR61a, VR62a and VR63a as the reference level VR6a under the control of the output signals S61, S62 and S63' of the decoder 11. The switch 5a selects, as the reference level VR6a, VR61a when S61 is "H", VR62a when S62 is "H", and VR63a when S63' is "H".

The switch 5b selects one of the falling decision levels VR61b, VR62b and VR63b as the reference level VR6b under the control of the output signals S62', S63 and S64 of the decoder 11. The switch 5b selects, as the reference level VR6b, VR63b when S62' is "H", VR62b when S63 is "H", and VR61b when S64 is "H".

The switch 6 selects one of the input thresholds VT61, VT62, VT63 and VT64 as the input threshold VT6 under the control of the output signals S61, S62, S63 and S64 of the decoder 11. Here, the switch 6 selects, as the input threshold VT6, VT61 when S61 is "H", VT62 when S62 is "H", VT63 when S63 is "H" and VT64 when S64 is "H".

Figure 14:
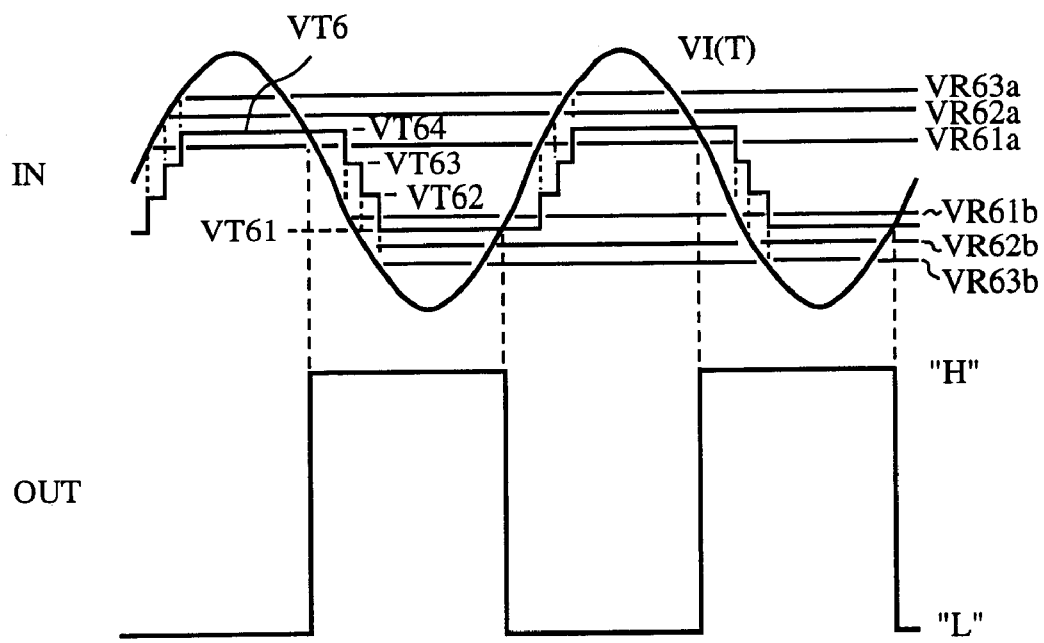
FIG. 14 is a diagram illustrating an example of waveforms of the input signal IN and output signal OUT together with the input threshold VT6 in the embodiment 6 of the automatic input threshold selector.

Next, the operation of the present embodiment 6 of the automatic input threshold selector will be described. FIG. 14 is a diagram illustrating an example of waveforms of the input threshold VT6 and output signal OUT with respect to the waveforms of the input signal IN of the present embodiment 6. Here, the temporal variations in the level of the input signal IN is depicted as VI(T). As illustrated in FIG. 14, when the input signal level VI (T) varies from the low to high level, the input threshold VT6 varies as VT61→VT62→VT63→VT64 every time VI (T) exceeds the rising decision levels VR61a, VR62a and VR63a. In contrast with this, when the signal level VI (T) varies from the high to low level, the input threshold VT6 varies as VT64→VT63→VT62→VT61 every time VI (T) falls below the falling decision levels VR61b, VR62b and VR63b.

The initial state of the automatic input threshold selector as shown in FIG. 13 is established by the reset signal (RST="H"), in which case, the outputs of the shift register 10 are placed at Q61=Q62=Q63="L" and Q61C=Q62C=Q63C="H", and the outputs of the decoder 11 are placed at S61=S62'="H" and S62=S63=S63'=S64="L". In this case, the switch 5a selects the rising decision level VR61a as the reference level VR6a (VR6a=VR61a), the switch 5b selects the falling decision level VR63b as the reference level VR6b (VR6b=VR63b), and the switch 6 selects the input threshold VT61 as the input threshold VT6 (VT6=VT61).

If the level VI (T) is below the falling decision level VR63b, the reset state is released (RST="L"). First, the operation when the level VI(T) increases toward the high level from the initial state. When the level VI(T) is lower than VR63b, the output of the voltage comparator 1b is at the "H" level, and the inverted outputs (QC) of the flip-flops FF5 and FF6 are at their initial value "H". Thus, the inverting inputs (K) of the flip-flops FF4, FF5 and FF6 are all placed at the "H" level. At the same time, since the output of the voltage comparator 1a is at the level "L", the non-inverting input (J) of the flip-flops FF4, FF5 and FF6 are all placed at the "L" level. When the rising edge of the clock signal CLK is supplied in this state, the non-inverted outputs (Q) of the flip-flops FF4, FF5 and FF6 are all placed at the "L" level with their inverted outputs (QC) placed at the "H" level, and the outputs of the shift register 10 maintain their initial state. In other words, unless the "H" level is input to any of the non-inverting inputs (J) of the flip-flops FF4, FF5 and FF6, the outputs of the shift register 10 do not vary, and hence the description will be omitted of the operation when the level VI (T) exceeds the levels VR63b, VR62b and VR61b.

When the level VI(T) exceeds the level VR61a, the output of the voltage comparator 1a is placed at the "H" level. In this case, since the non-inverted outputs (Q) of the flip-flops FF4 and FF5 are at the initial value "L", only the non-inverting input (J) of the flip-flop FF4 is placed at "H". When the rising edge of the clock signal CLK is supplied in this state, the non-inverted output (Q) of the flip-flop FF4 is changed to "H" and the inverted output (QC) is changed to "L". In this case, the outputs of the shift register 10 are placed at Q61C=Q62=Q63="L" and Q61=Q62C=Q63C="H", and the outputs of the decoder 11 are placed at S62=S62'="H" and S61=S63=S63'=S64="L". The change in the outputs of the decoder 11 causes the switch 5a to select VR62a as the reference level VR6a (VR6a=VR62a), the switch 5b to maintain selecting VR63b as the reference level VR6b (VR6b=VR63b), and the switch 6 to select VT62 as the input threshold VT6 (VT6=VT62).

When the level VI(T) exceeds the level VR62a, the output of the voltage comparator 1a is placed at "H". When the rising edge of the clock signal CLK is supplied in this state, the non-inverted output (Q) of the flip-flop FF5 is changed to "H", and the inverted output (QC) is changed to "L". In this case, the outputs of the shift register 10 are placed at Q61C=Q62C=Q63="L" and Q61=Q62=Q63C="H", and the outputs of the decoder 11 are placed at S63=S63'="H" and S61=S62=S62'=S64="L". The change in the outputs of the decoder 11 causes the switch 5a to select VR63a as the reference level VR6a (VR6a=VR63a), the switch 5b to select VR62b as the reference level VR6b (VR6b=VR62b), and the switch 6 to select VT63 as the input threshold VT6 (VT6=VT63).

When the level VI(T) exceeds the level VR63a, the output of the voltage comparator 1a is placed at "H". When the rising edge of the clock signal CLK is supplied in this state, the non-inverted output (Q) of the flip-flop FF6 is changed to "H", nand the inverted output (QC) is changed to "L". In this case, the outputs of the shift register 10 are placed at Q61C=Q62C=Q63C="L" and Q61=Q62=Q63="H", and the outputs of the decoder 11 are placed at S63'=S64="H" and S61=S62=S62'=S63="L". The change in the outputs of the decoder 11 causes the switch 5a to maintain selecting VR63a as the reference level VR6a (VR6a=VR63a), the switch 5b to select VR61b as the reference level VR6b (VR6b=VR61b), and the switch 6 to select VT64 as the input threshold VT6 (VT6=VT64).

Thus, when the input signal IN grows from the low to high level, the input threshold VT6 varies as VT61→VT62→VT63→VT64 every time the level of the input signal IN exceeds the rising decision levels VR61a, VR62a and VR63a.

Next, the operation will be described when the level VI (T) decreases from a level higher than the rising decision level VR63a toward the lower level.

When the level VI(T) is higher than VR63a, the output of the voltage comparator 1a is at the "H" level, and the non-inverted outputs (Q) of the flip-flops FF4 and FF5 are at "H". Thus, the non-inverting inputs (J) of the flip-flops FF4, FF5 and FF6 are all placed at "H". At the same time, since the output of the voltage comparator 1b is at "L", the inverting inputs (K) of all the flip-flops FF4, FF5 and FF6 are placed at "L". When the rising edge of the clock signal CLK is supplied in this state, the non-inverted outputs (Q) of all the flip-flops FF4, FF5 and FF6 are placed at "H" with their inverted outputs (QC) placed at "L", and the outputs of the shift register 10 maintains the previous state. In other words, unless the "H" level is input to any of the inverting inputs (K) of the flip-flops FF4, FF5 and FF6, the outputs of the shift register 10 do not vary, and hence the description will be omitted of the operation when the level VI(T) falls below the levels VR63a, VR62a and VR61a.

When the level VI (T) falls below the level VR61b, the output of the voltage comparator 1b is placed at the "H" level. In this case, since the inverted outputs (QC) of the flip-flops FF5 and FF6 are at "L", only the inverting input (K) of the flip-flop FF6 is placed at "H". When the rising edge of the clock signal CLK is supplied in this state, the non-inverted output (Q) of the flip-flop FF6 is changed to "L" and the inverted output (QC) is changed to "H". In this case, the outputs of the shift register 10 are placed at Q61C=Q62C=Q63="L" and Q61=Q62=Q63C="H", and the outputs of the decoder 11 are placed at S63=S63'="H" and S61=S62=S62'=S64="L". The change in the outputs of the decoder 11 causes the switch 5a to maintain selecting VR63a as the reference level VR6a (VR6a=VR63a), the switch 5b to select VR62b as the reference level VR6b (VR6b=VR62b), and the switch 6 to select VT63 as the input threshold VT6 (VT6=VT63).

When the level VI (T) falls below the level VR62b, the output of the voltage comparator 1b is placed at "H". When the rising edge of the clock signal CLK is supplied in this state, the non-inverted output (Q) of the flip-flop FF5 is changed to "L", and the inverted output (QC) is changed to "H". In this case, the outputs of the shift register 10 are placed at Q61C=Q62=Q63="L" and Q61=Q62C=Q63C="H", and the outputs of the decoder 11 are placed at S62=S62'="H" and S61=S63=S63'=S64="L". The change in the outputs of the decoder 11 causes the switch 5a to select VR62a as the reference level VR6a (VR6a=VR62a), the switch 5b to select VR63b as the reference level VR6b (VR6b=VR63b), and the switch 6 to select VT62 as the input threshold VT6 (VT6=VT62).

When the level VI (T) falls below the level VR63b, the output of the voltage comparator 1b is placed at "H". When the rising edge of the clock signal CLK is supplied in this state, the non-inverted output (Q) of the flip-flop FF4 is changed to "L", and the inverted output (QC) is changed to "H". In this case, the outputs of the shift register 10 are placed at Q61=Q62=Q63="L" and Q61C=Q62C=Q63C="H", and the outputs of the decoder 11 are placed at S61=S62'="H" and S62=S63=S63'=S64="L". The change in the outputs of the decoder 11 causes the switch 5a to maintain selecting VR61a as the reference level VR6a (VR6a=VR61a), the switch 5b to select VR63b as the reference level VR6b (VR6b=VR63b), and the switch 6 to select VT61 as the input threshold VT6 (VT6=VT61).

Thus, when the input signal IN decreases from the high to low level, the input threshold VT6 varies such as VT64÷VT63→VT62→VT61 every time the level of the input signal IN falls below the falling decision level VR61b, VR62b and VR63b.

According to the present embodiment 6, the voltage comparator 1a, shift register 10, decoder 11 and reference level selecting switch 5a constitute a rising decision level identifying means; the voltage comparator 1b, shift register 10, decoder 11 and reference level selecting switch 5b constitute a falling decision level identifying means; and the decoder 11 and input threshold selecting switch 6 constitute an input threshold setting means for setting the input threshold VT6 in response to the rising decision level identified by the rising decision level identifying means when the input signal IN is rising, and in response to the falling decision level identified by the falling decision level identifying means when the input signal is falling. This offers an advantage of being able to implement a circuit that can successively set the input threshold automatically in accordance with the level changes in the rising edge and falling edge of the input signal.

In addition, the automatic input threshold selector can be constructed rather easily in the form of a combination of the voltage comparators, logical gates and the like. This offers an advantage of being able to implement a small size, low power consumption circuit.

Incidentally, although the present embodiment 6 of the automatic input threshold selector as shown in FIG. 13 has three rising decision levels, three falling decision levels and four input threshold candidates, it is obvious that their numbers are not limited to these numbers, and can be determined at any numbers according to the performance required of the automatic input threshold selector.

Embodiment 7

Figure 15:
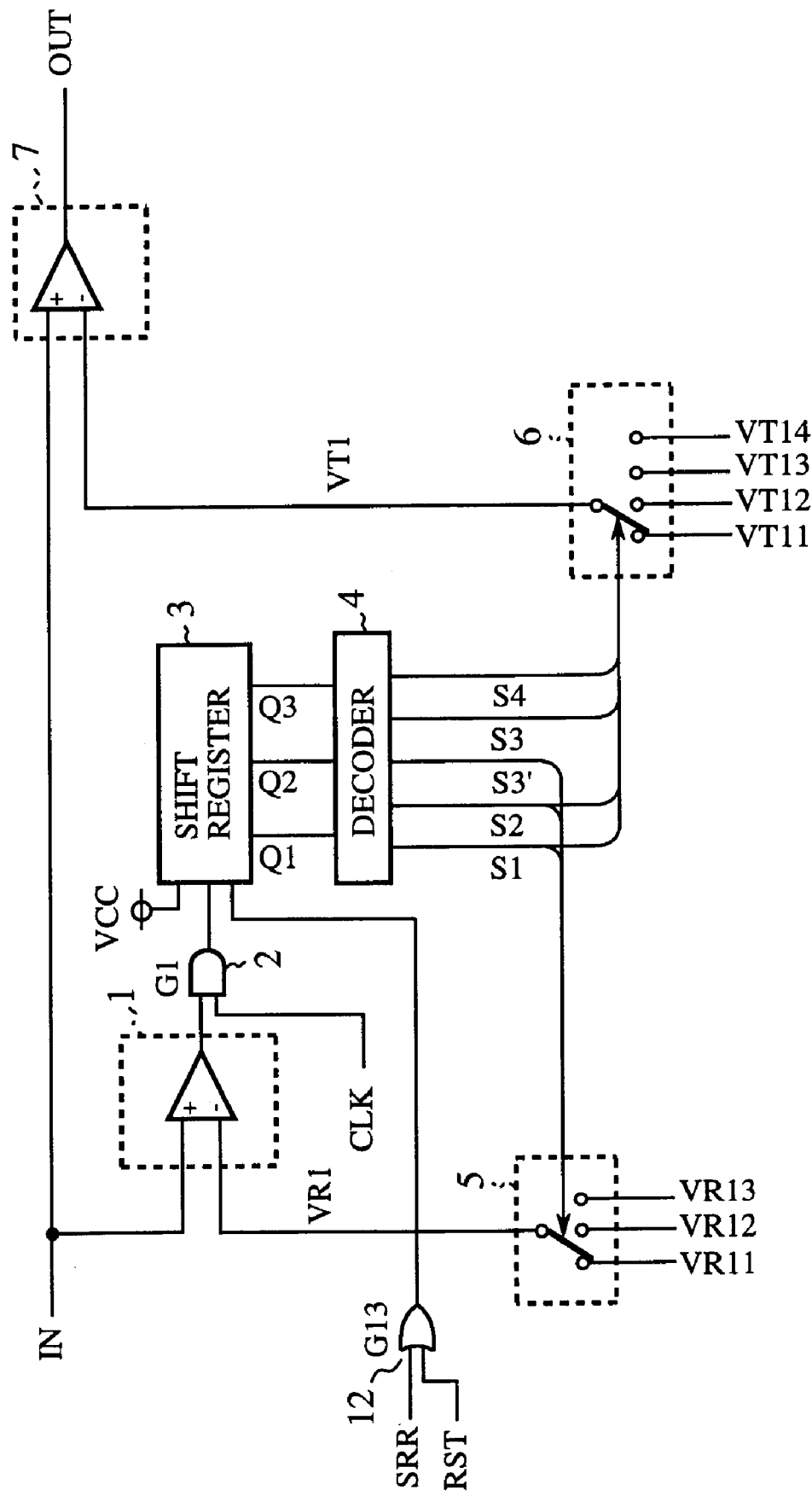
FIG. 15 is a circuit diagram showing a configuration of an embodiment 7 of the automatic input threshold selector in accordance with the present invention.

FIG. 15 is a circuit diagram showing an embodiment 7 of the automatic input threshold selector in accordance with the present invention. The present embodiment 7 of the automatic input threshold selector is characterized in that its initialization is controllable by software. In FIG. 15, the same reference numerals designate the same or like portions to those of FIG. 1, and the description thereof is omitted here.

In FIG. 15, the reference numeral 12 designates a two-input OR gate. The reference symbol SRR designates a shift register initializing signal controlled by the central processing unit (CPU) of a one-chip microcomputer, for example. The reference symbol RST designates a reset signal controlled by hardware. The OR gate 12 receives the shift register initializing signal SRR and reset signal RST, and outputs an "H" level signal when at least one of the two inputs takes the "H" level. The output signal line of the OR gate 12 is connected to the reset input terminal of the shift register 3.

Next, the operation of the present embodiment will be described.

Even in the state in which the hardware reset is released (RST="L"), it is possible for the CPU to issue the instruction by software for placing the shift register initializing signal SRR at the "H" level (SRR="H") to supply the reset input terminal of the shift register 3 with the "H" level signal. This causes the shift register 3 to be initialized, thereby returning the decoder 4, switch 5 and switch 6 to the initial state.

According to the present embodiment 7, an input threshold initializing means for initializing by software the once established input threshold is configured by connecting the output line of the OR gate 12 that receives the shift register initializing signal SRR to the reset input terminal of the shift register 3. This offers an advantage of being able to implement the automatic input threshold selector capable of initializing the circuit by software.

Although the present embodiment 7 of the automatic input threshold selector as shown in FIG. 15 is constructed by modifying the foregoing embodiment 1, the automatic input threshold selector is not limited to such a circuit configuration. For example, other circuits can be configured in which the shift register initializing signal generated by means of software is directly supplied to the reset input terminal of the shift register 3. In addition, the present embodiment 7 of the automatic input threshold selector can be embedded into a one-chip microcomputer.

Embodiment 8

Figure 16:
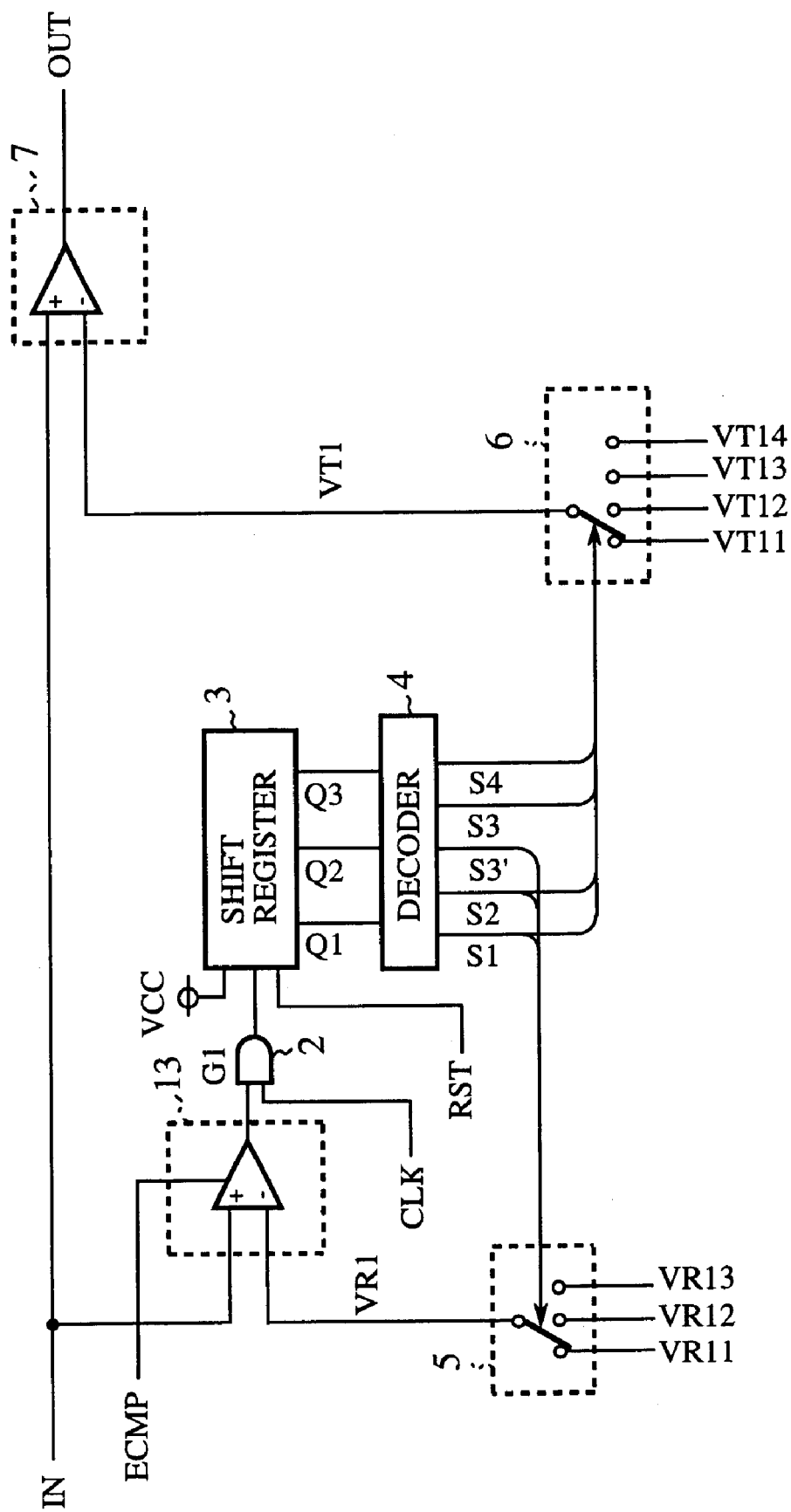
FIG. 16 is a circuit diagram showing a configuration of an embodiment 8 of the automatic input threshold selector in accordance with the present invention.

FIG. 16 is a circuit diagram showing an embodiment 8 of the automatic input threshold selector in accordance with the present invention. The present embodiment 8 of the automatic input threshold selector is characterized in that it can control enable/disable of the level decision of the input signal by software. In FIG. 16, the same reference numerals designate the same or like portions to those of FIG. 1, and the description thereof is omitted here.

In FIG. 16, the reference numeral 13 designate a voltage comparator with an enable input, which replaces the voltage comparator 1 of the foregoing embodiment 1 of the automatic input threshold selector. The voltage comparator 13 with an enable input carries out the normal operation when the enable input is at the "H" level, whereas it locks its output at the "L" level as long as the enable input is placed at the "L" level. The reference symbol ECMP designates an enable signal supplied to the enable input terminal of the voltage comparator 13, which is controlled by a CPU.

Next, the operation of the present embodiment 8 will be described.

While the enable signal ECMP is at the "H" level, the voltage comparator 13 carries out the normal operation, causing the present embodiment 8 of the automatic input threshold selector to perform the same operation as the embodiment 1. In contrast, while the enable signal ECMP is placed at the "L" level, the output of the voltage comparator 13 is locked at the "L" level. This prevents the clock signal CLK from being supplied to the shift register 3, thereby keeping the state of the shift register 3 unchanged, and maintaining the state of the decoder 4, switch 5 and switch 6 and the input threshold VT1.

According to the embodiment 8, the voltage comparator 13 with the enable input for locking its output constitutes an input threshold holding means for holding the present input threshold VT1 by halting the level decision of the input signal by software. This offers an advantage of being able to implement the automatic input threshold selector capable of holding the present input threshold. In addition, it has an advantage of being able to reduce the power consumption by disabling the level decision operation after the input threshold has been established.

Although the present embodiment 8 of the automatic input threshold selector as shown in FIG. 16 is implemented by modifying the foregoing embodiment 1, the configuration of the automatic input threshold selector is not limited to such a circuit configuration. Other circuit configurations can be implemented which are characterized by comprising the voltage comparator 13 with the enable signal input terminal for locking the output of the voltage comparator 13 at the "L" level. In addition, the present embodiment 8 of the automatic input threshold selector can be installed into a one-chip microcomputer.

Embodiment 9

Figure 17:
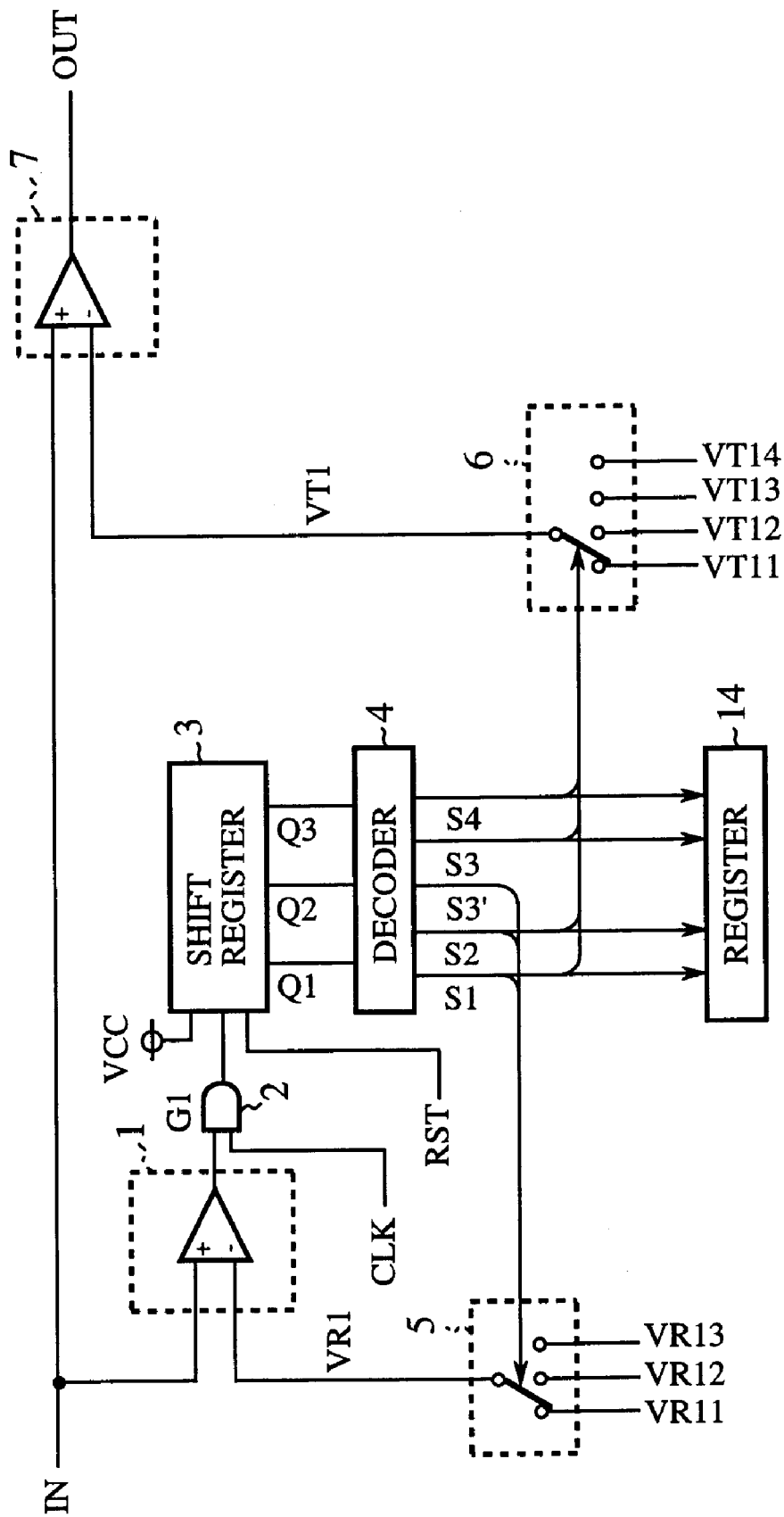
FIG. 17 is a circuit diagram showing a configuration of an embodiment 9 of the automatic input threshold selector in accordance with the present invention.

FIG. 17 is a circuit diagram showing an embodiment 9 of the automatic input threshold selector in accordance with the present invention. The present embodiment 9 is characterized in that it can check the input threshold by software. In FIG. 17, the same reference numerals designate the same or like portions to those of FIG. 1, and the description thereof is omitted here.

In FIG. 17, the reference numeral 14 designate a register for storing the outputs S1, S2, S3 and S4 of the decoder 4.

Next, the operation of the present embodiment 9 will be described.

The voltage comparator 1, AND gate 2, shift register 3, decoder 4, switch 5, switch 6 and voltage comparator 7 as shown in FIG. 17 carry out the same operation as those of the embodiment 1 of the automatic input threshold selector as shown in FIG. 1. Accordingly, the input threshold VT1 is determined by the outputs S1, S2, S3 and S4 of the decoder 4, which are stored in the register 14. Thus, reading the values stored in the register 14 enables a CPU to check the currently selected input threshold VT1 indirectly.

According to the present embodiment 9, the register 14 for storing the outputs of the decoder 4 constitutes an input threshold check means for checking the current input threshold VT1 by software. This offers an advantage of being able to implement the automatic input threshold selector capable of checking the input threshold by software.

Although the present embodiment 9 of the automatic input threshold selector as shown in FIG. 17 is implemented by modifying the foregoing embodiment 1, the configuration of the automatic input threshold selector is not limited to such a circuit configuration. Other circuit configurations can be implemented which are characterized by comprising the register for storing the outputs of the decoder 4. In addition, the present embodiment 9 of the automatic input threshold selector can be installed onto a one-chip microcomputer.

Embodiment 10

Figure 18:
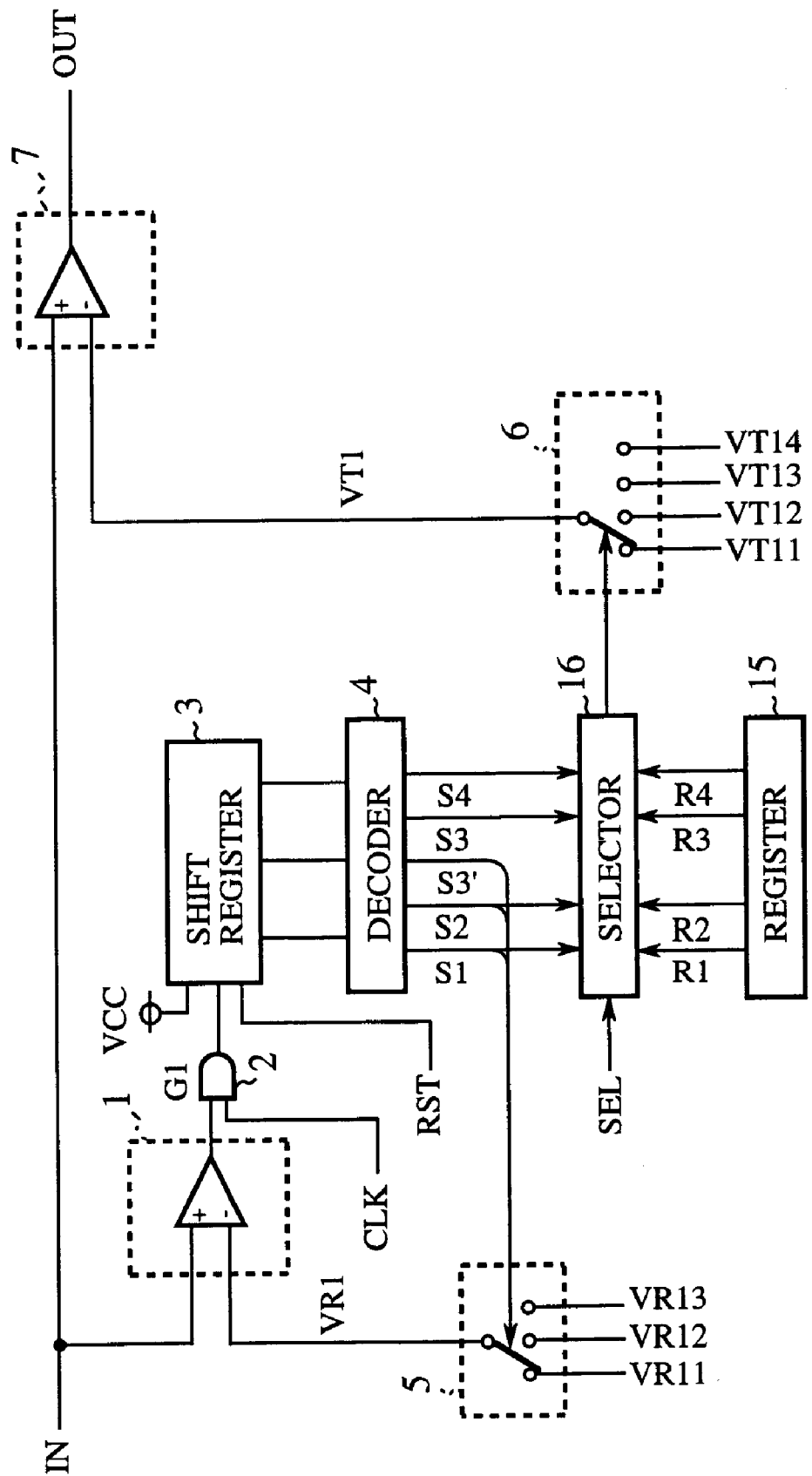
FIG. 18 is a circuit diagram showing a configuration of an embodiment 10 of the automatic input threshold selector in accordance with the present invention.
Figure 19:
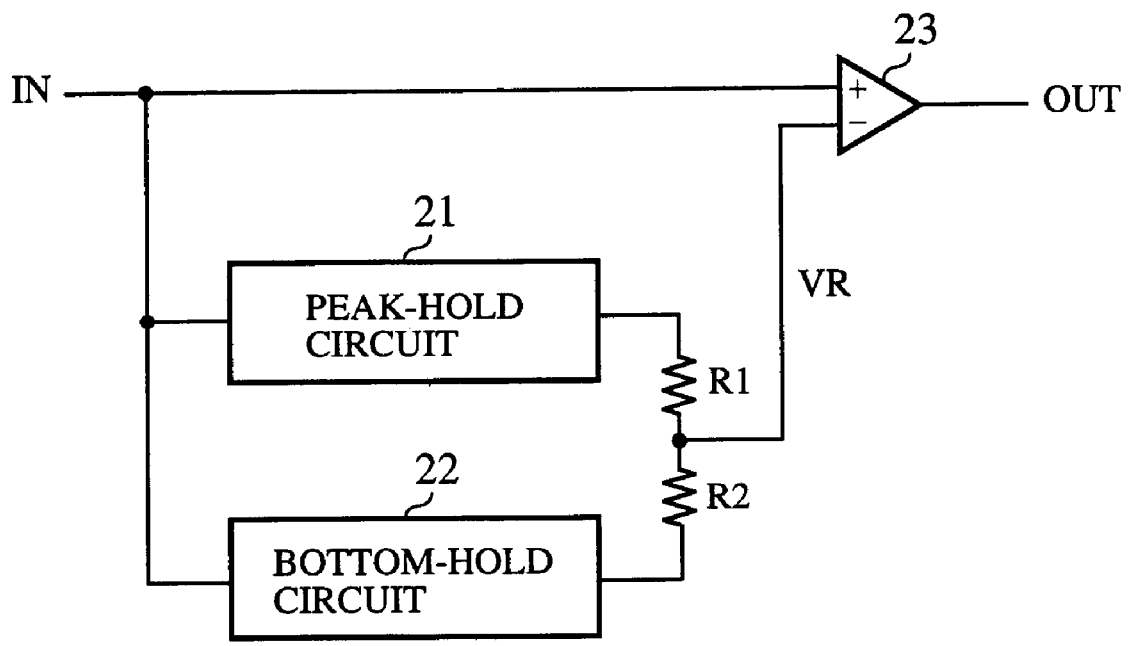
FIG. 19 is a schematic diagram showing a configuration of a conventional automatic input threshold selector.

FIG. 18 is a block diagram showing an embodiment 10 of the automatic input threshold selector in accordance with the present invention. The present embodiment 10 is characterized by comprising an additional function of setting the input threshold by means of software. In FIG. 18, the same reference numerals designate the same or like portions to those of FIG. 1, and the description thereof it omitted here. In FIG. 18, the reference numeral 15 designates a register, and 16 designates a selector. The reference symbol SEL designates a select signal, which is controlled by a CPU.

Next, the operation of the present embodiment 10 will be described.

Because the voltage comparator 1, AND gate 2, shift register 3, decoder 4 and switch 5 as shown in FIG. 18 carry out the same operation as those of the embodiment 1 as shown FIG. 1, the outputs S1, S2, S3 and S4 of the decoder 4 are determined by the maximum value of the input signal IN. In addition, the CPU sets logical values R1, R2, R3 and R4 in the register 15.

The selector 16 receives the set of the outputs S1, S2, S3 and S4 of the decoder 4 and the set of the logical values R1, R2, R3 and R4 of the register 15, and selects one of them under the control of the select signal SEL. Let us assume that when the select signal SEL is at the "H" level, the selector 16 outputs the set of the values S1, S2, S3 and S4, whereas when the select signal SEL is at the "L" level, the selector 16 outputs the set of the values R1, R2, R3 and R4. The switch 6 selects one of the input threshold candidates VT11, VT12, VT13 and VT14 as the input threshold VT1 under the control of the output of the selector 16. The voltage comparator 7 carries out the same operation as the voltage comparator 7 of the embodiment 1. Specifically, setting the value of the register 15 at a desired value by means of software, and placing the select signal SEL at "L" makes it possible to set the input threshold at a desired level.

According to the present embodiment 10, the register 15 and selector 16 constitute an input threshold setting means for setting the input threshold at a desired value by means of software. This offers an advantage of being able to implement the automatic input threshold selector capable of setting the input threshold at a desired value by means of software.

Although the present embodiment 10 of the automatic input threshold selector as shown in FIG. 18 is implemented by modifying the foregoing embodiment 1, the configuration of the automatic input threshold selector is not limited to such a circuit configuration. Other circuit configurations can be implemented which are characterized by comprising the selector 16 for receiving the outputs of the decoder 4 and register 15, and for selectively outputting one of them by means of software. In addition, the embodiment 10 of the automatic input threshold selector can be installed onto a one-chip microcomputer.

As described above, the automatic input threshold selector of the embodiments 1–10, which is configured rather easily by combining the voltage comparator, logic gates and the like, can be implemented as a small scale, low power consumption circuit. In addition, it is suitably installed onto a one-chip microcomputer because of the small scale circuit configuration. This makes it possible to facilitate various controls in accordance with its applications.

What is claimed is:

1. An automatic input threshold selector comprising:
    level decision means for deciding, among a plurality of level ranges determined by a predetermined number of decision levels, a level range to which a level of an input signal belongs; and
    input threshold setting means for selecting, in response to the level range decided by said level decision means, at least one of input threshold candidates from among a predetermined number of input threshold candidates,
    wherein said level decision means decides, among the plurality of level ranges, a level range to which one of a maximum value and a minimum value of the input signal belongs; and said input threshold setting means selects, in response to the level range decided by said level decision means, at least one of n input threshold candidates, where n is a natural number,
    wherein said level decision means comprises:
        a reference level selecting switch for selecting one of the predetermined number of decision levels as a reference level;
        a first voltage comparator for comparing the input signal with the reference level;
        a logic gate for carrying out on-off control of a clock signal in response to an output signal of said voltage comparator;
        a shift register for shifting, in response to an output signal of said logic gate, its output state every time the input signal crosses the reference level in one of rising and falling directions of the input signal; and
        a decoder for outputting signals for identifying the level range of the input signal in response to output signals of said shift register,
    wherein said reference level selecting switch selects the reference level in accordance with the output signals of said decoder, and
    wherein said input threshold setting means comprises:
        an input threshold selecting switch for selecting, in response to the outputs of said decoder, one of the n input threshold candidates as the input threshold, and
    wherein said automatic input threshold selector further comprises a second voltage comparator for comparing the input signal with the input threshold.

2. The automatic input threshold selector according to claim 1, further comprising a signal line, connected to a reset input terminal of said shift register, for supplying said shift register with a shift register initializing signal by means of software.

3. The automatic input threshold selector according to claim 1, wherein said first voltage comparator comprises an enable signal input terminal for supplying said first voltage comparator with an enable signal for locking an output of said first voltage comparator.

4. The automatic input threshold selector according to claim 1, wherein said input threshold setting means comprises a register for storing the outputs of said decoder.

5. The automatic input threshold selector according to claim 1, wherein said input threshold setting means comprises a register for storing a desired value determined by means of software, and a selector for selecting one of the output of said decoder and an output of said register for controlling said input threshold selecting switch.

* * * * *